United States Patent
Komoto et al.

(10) Patent No.: US 9,293,387 B2
(45) Date of Patent: Mar. 22, 2016

(54) FILM FOR FLIP CHIP TYPE SEMICONDUCTOR BACK SURFACE, DICING TAPE-INTEGRATED FILM FOR SEMICONDUCTOR BACK SURFACE, PROCESS FOR PRODUCING SEMICONDUCTOR DEVICE, AND FLIP CHIP TYPE SEMICONDUCTOR DEVICE

(75) Inventors: Yusuke Komoto, Osaka (JP); Naohide Takamoto, Osaka (JP); Goji Shiga, Osaka (JP); Fumiteru Asai, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 13/191,791

(22) Filed: Jul. 27, 2011

(65) Prior Publication Data

US 2012/0025400 A1 Feb. 2, 2012

(30) Foreign Application Priority Data

Jul. 28, 2010 (JP) .................. 2010-169501

(51) Int. Cl.
*H01L 21/56* (2006.01)
*H01L 23/31* (2006.01)
(Continued)

(52) U.S. Cl.
CPC .......... *H01L 23/3157* (2013.01); *C09J 163/00* (2013.01); *H01L 21/563* (2013.01); *H01L 21/6836* (2013.01); *H01L 24/81* (2013.01); H01L 24/13 (2013.01); H01L 24/16 (2013.01); H01L 2221/68327 (2013.01); H01L 2221/68336 (2013.01); H01L 2221/68386 (2013.01); H01L 2224/131 (2013.01); H01L 2224/13111 (2013.01); H01L 2224/13144 (2013.01); H01L 2224/13147 (2013.01); H01L 2224/16225 (2013.01); H01L 2224/16227 (2013.01); H01L 2224/16245 (2013.01);
(Continued)

(58) Field of Classification Search
CPC .................................................... H01L 21/6836
USPC ........................................................ 257/778
See application file for complete search history.

(56) References Cited

U.S. PATENT DOCUMENTS 5,049,981 A * 9/1991 Dahringer ...................... 257/718
5,895,976 A * 4/1999 Morrell et al. ................. 257/778
(Continued)

FOREIGN PATENT DOCUMENTS

CN      1202983 A      12/1998
CN      1666326 A      9/2005
(Continued)

OTHER PUBLICATIONS

Dictionary.com's definition of "film", available Aug. 21, 2013 at http://dictionary.reference.com/browse/film?s=t, Based on the Random House Dictionary, © Random House, Inc. 2013.*
(Continued)

*Primary Examiner* — Matthew Landau
*Assistant Examiner* — Eric Ward
(74) *Attorney, Agent, or Firm* — Sughrue Mion, PLLC

(57) ABSTRACT

The present invention relates to a film for flip chip type semiconductor back surface to be formed on a back surface of a semiconductor element flip chip-connected onto an adherend, in which the film for flip chip type semiconductor back surface before thermal curing has, at the thermal curing thereof, a volume contraction ratio within a range of 23° C. to 165° C. of 100 ppm/° C. to 400 ppm/° C.

6 Claims, 2 Drawing Sheets

(51) Int. Cl.
- *H01L 21/683* (2006.01)
- *C09J 163/00* (2006.01)
- *H01L 23/00* (2006.01)

(52) U.S. Cl.
CPC ........... *H01L 2224/73204* (2013.01); *H01L 2224/81007* (2013.01); *H01L 2224/81191* (2013.01); *H01L 2224/81203* (2013.01); *H01L 2224/81815* (2013.01); *H01L 2924/0001* (2013.01); *H01L 2924/0102* (2013.01); *H01L 2924/0103* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01024* (2013.01); *H01L 2924/01029* (2013.01); *H01L 2924/01033* (2013.01); *H01L 2924/01042* (2013.01); *H01L 2924/01045* (2013.01); *H01L 2924/01047* (2013.01); *H01L 2924/01051* (2013.01); *H01L 2924/01056* (2013.01); *H01L 2924/01074* (2013.01); *H01L 2924/01075* (2013.01); *H01L 2924/01079* (2013.01); *H01L 2924/01082* (2013.01); *H01L 2924/15787* (2013.01); *H01L 2924/15788* (2013.01); *H01L 2924/181* (2013.01); *Y10T 428/31504* (2015.04)

(56) References Cited

U.S. PATENT DOCUMENTS

| | | | | |
|---|---|---|---|---|
| 5,936,304 | A | * | 8/1999 | Lii et al. ............... 257/701 |
| 6,097,610 | A | * | 8/2000 | Hashimoto ............ 361/760 |
| 6,351,032 | B1 | * | 2/2002 | Lee et al. .............. 257/706 |
| 6,404,049 | B1 | | 6/2002 | Shibamoto et al. |
| 6,448,665 | B1 | * | 9/2002 | Nakazawa et al. ..... 257/789 |
| 6,472,762 | B1 | * | 10/2002 | Kutlu ..................... 257/778 |
| 6,563,212 | B2 | * | 5/2003 | Shibamoto et al. ..... 257/712 |
| 6,717,274 | B2 | * | 4/2004 | Shibata ................. 257/778 |
| 6,756,685 | B2 | * | 6/2004 | Tao ....................... 257/778 |
| 6,940,177 | B2 | * | 9/2005 | Dent et al. ............. 257/779 |
| 6,982,484 | B2 | | 1/2006 | Ogura et al. |
| 7,446,405 | B2 | * | 11/2008 | Kim et al. ............. 257/690 |
| 7,785,926 | B2 | | 8/2010 | Yoshimura et al. |
| 7,935,574 | B2 | | 5/2011 | Saiki et al. |
| 2002/0066955 | A1 | | 6/2002 | Shibamoto et al. |
| 2002/0105070 | A1 | | 8/2002 | Shibamoto et al. |
| 2003/0030134 | A1 | | 2/2003 | Tao |
| 2003/0031867 | A1 | | 2/2003 | Ogura et al. |
| 2003/0214051 | A1 | | 11/2003 | Dent et al. |
| 2004/0104326 | A1 | | 6/2004 | Demel et al. |
| 2006/0102987 | A1 | | 5/2006 | Saiki et al. |
| 2006/0128065 | A1 | * | 6/2006 | Inada et al. ............ 438/118 |
| 2006/0226520 | A1 | * | 10/2006 | Yoshimura et al. ..... 257/666 |
| 2007/0182022 | A1 | | 8/2007 | Kim et al. |
| 2009/0053518 | A1 | | 2/2009 | Saiki et al. |
| 2010/0062566 | A1 | | 3/2010 | Yoshimura et al. |
| 2010/0136275 | A1 | * | 6/2010 | Amano ................. 428/40.1 |

FOREIGN PATENT DOCUMENTS

| | | |
|---|---|---|
| CN | 1841688 A | 10/2006 |
| CN | 101752217 A | 6/2010 |
| JP | 9-213741 A | 8/1997 |
| JP | 2004-063551 A | 2/2004 |
| JP | 2004-072108 A | 3/2004 |
| JP | 2004-142430 A | 5/2004 |
| JP | 2004-214288 A | 7/2004 |
| JP | 2004-221169 A | 8/2004 |
| JP | 2006140348 A | 6/2006 |
| JP | 2006213899 A | 8/2006 |
| JP | 2007002173 A | 1/2007 |
| JP | 2007-158026 A | 6/2007 |
| JP | 2007-250970 A | 9/2007 |
| JP | 2007-261035 A | 10/2007 |
| JP | 2008-006386 A | 1/2008 |
| JP | 2008-166451 A | 7/2008 |
| JP | 2008203605 A | 9/2008 |
| KR | 20020044569 A | 6/2002 |
| TW | I265578 B | 11/2006 |

OTHER PUBLICATIONS

Office Action dated Apr. 30, 2013 issued by the Japanese Patent Office in counterpart Japanese Application No. 2010169501.

Office Action dated Oct. 31, 2014, issued by the State Intellectual Property Office of P.R. China in counterpart Chinese Application No. 201110217098.2.

Office Action dated Dec. 10, 2014, issued by the Korean Intellectual Property Office in counterpart Korean Application No. 10-2011-0074666.

Communication from the Korean Intellectual Property Office dated Mar. 18, 2015 in a counterpart Korean application No. 10-2011-0074666.

Notice of Final Rejection issued in corresponding to Korean Patent Application No. KR 10-2011-0074666, dated May 15, 2015.

Office Action issued on Nov. 19, 2015 by the Korean Intellectual Property Office in counterpart Korean Application No. 10-2015-0109907.

* cited by examiner

FILM FOR FLIP CHIP TYPE SEMICONDUCTOR BACK SURFACE, DICING TAPE-INTEGRATED FILM FOR SEMICONDUCTOR BACK SURFACE, PROCESS FOR PRODUCING SEMICONDUCTOR DEVICE, AND FLIP CHIP TYPE SEMICONDUCTOR DEVICE

FIELD OF THE INVENTION

The present invention relates to a film for flip chip type semiconductor back surface and a dicing tape-integrated film for semiconductor back surface. The film for flip chip type semiconductor back surface is used for the purposes of protecting a back surface of a semiconductor element such as a semiconductor chip and enhancing strength thereof and the like. Also, the invention relates to a process for producing a semiconductor device using a dicing tape-integrated film for semiconductor back surface and a flip chip type semiconductor device.

BACKGROUND OF THE INVENTION

Recently, thinning and miniaturization of a semiconductor device and its package have been increasingly demanded. Therefore, as the semiconductor device and its package, flip chip type semiconductor devices in which a semiconductor element such as a semiconductor chip is mounted (flip chip-connected) on a substrate by means of flip chip bonding have been widely utilized. In such flip chip connection, a semiconductor chip is fixed to a substrate in a form where a circuit face of the semiconductor chip is opposed to an electrode-formed face of the substrate. In such a semiconductor device or the like, there may be a case where the back surface of the semiconductor chip is protected with a protective film to prevent the semiconductor chip from damaging or the like (see, Patent Document 1 to 10).

Patent Document 1: JP-A-2008-166451
Patent Document 2: JP-A-2008-006386
Patent Document 3: JP-A-2007-261035
Patent Document 4: JP-A-2007-250970
Patent Document 5: JP-A-2007-158026
Patent Document 6: JP-A-2004-221169
Patent Document 7: JP-A-2004-214288
Patent Document 8: JP-A-2004-142430
Patent Document 9: JP-A-2004-072108
Patent Document 10: JP-A-2004-063551

However, the protection of the back surface of a semiconductor chip with a protective film requires an additional step of attaching the protective film to the back surface of the semiconductor chip obtained in a dicing step. As a result, the number of the processing steps increases and the production cost is thereby increased. Moreover, the recent tendency toward thinning may result in that semiconductor chips are sometimes damaged in the step of picking up the semiconductor chips. Accordingly, until the picking-up step inclusive, semiconductor wafers and semiconductor chips are required to be reinforced for the purpose of enhancing the mechanical strength thereof. In particular, the thinning of the semiconductor chips may generate warp on the semiconductor chips in some cases, so that suppression or prevention of the generation of warp is required.

SUMMARY OF THE INVENTION

The present invention has been made in consideration of the foregoing problem and an object thereof is to provide a film for flip chip type semiconductor back surface capable of suppressing or preventing the generation of warp on a semiconductor element flip chip-connected on an adherend, and a dicing tape-integrated wafer back surface protective film.

Moreover, another object of the invention is to provide a process for producing a semiconductor device capable of flip chip-connecting a semiconductor element on an adherend with suppressing the generation of warp and, as a result, capable of improving a production yield.

In order to solve the foregoing related-art problems, the present inventors made extensive and intensive investigations. As a result, it has been found that the generation of warp on the semiconductor flip chip-connected on an adherend can be reduced by controlling a volume contraction ratio at thermal curing of a film for flip chip type semiconductor back surface, leading to accomplishment of the invention.

Namely, the present invention provides a film for flip chip type semiconductor back surface to be formed on a back surface of a semiconductor element flip chip-connected onto an adherend, wherein the film for flip chip type semiconductor back surface before thermal curing has, at the thermal curing thereof, a volume contraction ratio within a range of 23° C. to 165° C. of 100 ppm/° C. to 400 ppm/° C.

In flip chip mounting, it is common that a molding resin for encapsulating the whole of a semiconductor package is not used and only a bump connection part between the adherend and the semiconductor element is encapsulated with an encapsulating resin called underfill. Therefore, the back surface of the semiconductor element is naked. For example, at the time when the encapsulating resin is thermally cured, a stress is applied to the semiconductor element owing to the curing and contraction thereof and, resulting from the stress, warp may be generated on the semiconductor element in some cases. Particularly, in a thin semiconductor element having a thickness of 300 μm or less (further, a thickness of 200 μm or less), the generation of warp becomes remarkable.

The film for flip chip type semiconductor back surface of the invention exerts the function of protecting a semiconductor element flip chip-connected onto an adherend when the film is formed on a back surface of the semiconductor element. Moreover, the film for flip chip type semiconductor back surface of the invention is simultaneously cured and contracted at the thermal curing of the encapsulating resin. On this occasion, according to the film for flip chip type semiconductor back surface of the invention, since a volume contraction ratio within a range of 23° C. to 165° C. at thermal curing of the film for flip chip type semiconductor back surface before thermal curing is 100 ppm/° C. or more, against the stress acting on the semiconductor element, the film can apply a stress offsetting or alleviating the stress to the semiconductor element. As a result, the warp of the semiconductor element before the reflow step can be effectively suppressed or prevented. Moreover, since the volume contraction ratio is 400 ppm/° C. or less, an appropriate degree of contraction corresponding to the degree of contraction of the encapsulating material can be achieved. Incidentally, the back surface of the semiconductor element means a surface opposite to the surface thereof on which a circuit is formed.

In the foregoing constitution, the film for semiconductor back surface after the thermal curing preferably has a tensile storage modulus at 23° C. of 1 GPa to 5 GPa. When the tensile storage modulus after the thermal curing is 1 GPa or more, the warp can be more effectively suppressed or prevented. Moreover, when the tensile storage modulus after the thermal curing is 5 GPa or less, the generation of the warp to the reverse side can be suppressed or prevented.

In the foregoing constitution, the film for flip chip type semiconductor back surface preferably has a thickness of 10 µm to 40 µm. By controlling the thickness to 10 µm or more, the warp can be more effectively suppressed or prevented. Moreover, by controlling the thickness to 40 µm or less, the generation of the warp to the reverse side can be suppressed or prevented. Furthermore, by controlling the thickness to 40 µm or less, it becomes possible to thin a semiconductor device composed of the semiconductor element flip chip-mounted on the adherend.

The present invention also provides a dicing tape-integrated film for semiconductor back surface, comprising a dicing tape and the above-mentioned film for flip chip type semiconductor back surface laminated on the dicing tape, wherein the dicing tape comprises a base material and a pressure-sensitive adhesive layer laminated on the base material, and the film for flip chip type semiconductor back surface is laminated on the pressure-sensitive adhesive layer of the dicing tape.

According to the dicing tape-integrated film for semiconductor back surface having the constitution as above, since the dicing tape and the film for flip chip type semiconductor back surface are formed in an integrated form, the dicing tape-integrated film for semiconductor back surface can also be provided for a dicing step of dicing a semiconductor wafer to prepare a semiconductor element or the subsequent picking-up step. Namely, when a dicing tape is attached to the back surface of a semiconductor wafer prior to the dicing step, the film for semiconductor back surface can also be attached thereto, and therefore, a step of attaching the film for semiconductor back surface alone (attaching step of the film for semiconductor back surface) is not required. As a result, the number of processing steps may be reduced. Additionally, since the film for semiconductor back surface protects the back surface of the semiconductor wafer and that of the semiconductor element formed by dicing, damaging of the semiconductor element can be reduced or prevented during the dicing step and the subsequent steps (e.g., picking-up step). As a result, the production yield of the flip chip type semiconductor device can be improved.

The present invention further provides a process for producing a semiconductor device using the above-mentioned dicing tape-integrated film for semiconductor back surface, the process comprising: attaching a semiconductor wafer onto the film for flip chip type semiconductor back surface of the dicing tape-integrated film for semiconductor back surface, dicing the semiconductor wafer to form a semiconductor element, peeling the semiconductor element from the pressure-sensitive adhesive layer of the dicing tape together with the film for flip chip type semiconductor back surface, and connecting the semiconductor element onto an adherend.

In the foregoing process, since the dicing tape-integrated film for semiconductor back surface is attached to the back surface of the semiconductor wafer and therefore, the step of attaching the film for semiconductor back surface alone (attaching step of the film for semiconductor back surface) is not required. Moreover, since the back surface of the semiconductor wafer and the semiconductor element is protected by the film for semiconductor back surface during the dicing of the semiconductor wafer and the picking-up of the semiconductor element formed by the dicing, damaging and the like can be prevented. As a result, the flip chip type semiconductor device can be produced with an improved production yield.

The foregoing step of flip chip connecting preferably comprises filling an encapsulating resin into a gap between the adherend and the semiconductor element flip chip-bonded on the adherend, followed by thermally curing the encapsulating resin.

At the time when the encapsulating resin is thermally cured, a stress is applied to the semiconductor element owing to the curing and contraction thereof and, resulting from the stress, warp may be generated on the semiconductor element in some cases. Particularly, in a thin semiconductor element having a thickness of 300 µm or less (further, a thickness of 200 µm or less), the generation of the warp becomes remarkable. However, in the foregoing process, since the film for flip chip type semiconductor back surface exhibits a volume contraction ratio of 100 ppm/° C. or more within a range of 23° C. to 165° C. at the thermal curing of the film for flip chip type semiconductor back surface before thermal curing, against the stress acting on the semiconductor element, the film can apply a stress offsetting or alleviating the stress to the semiconductor element. As a result, the warp of the semiconductor element before the reflow step can be effectively suppressed or prevented. Moreover, since the volume contraction ratio is 400 ppm/° C. or less, an appropriate degree of contraction corresponding to the degree of contraction of the encapsulating material can be achieved.

The present invention furthermore provides a flip chip type semiconductor device, which is manufactured by the above-mentioned process.

According to the film for flip chip type semiconductor back surface of the invention, since the film is formed on a back surface of a semiconductor element flip chip-connected on an adherend, the film exerts the function of protecting the semiconductor element. Moreover, since the film for flip chip type semiconductor back surface exhibits a volume contraction ratio of 100 ppm/° C. to 400 ppm/° C. within a range of 23° C. to 165° C. at thermal curing of the film for flip chip type semiconductor back surface before thermal curing, the warp of the semiconductor element before the reflow step can be effectively suppressed or prevented.

Moreover, according to the dicing tape-integrated film for semiconductor back surface of the invention, the dicing tape and the film for flip chip type semiconductor back surface are formed in an integrated form, and therefore, the dicing tape-integrated film for semiconductor back surface can also be provided for a dicing step of dicing a semiconductor wafer to prepare a semiconductor element or the subsequent picking-up step. As a result, a step of attaching the film for semiconductor back surface alone (attaching step of the film for semiconductor back surface) is not required. Furthermore, in the subsequent dicing step and pick-up step, since the film for semiconductor back surface is attached to the back surface of the semiconductor wafer or the back surface of the semiconductor element formed by dicing, the semiconductor wafer and the semiconductor element can be effectively protected and the damage of the semiconductor element can be suppressed or prevented. Moreover, at the time of flip chip-connection of the semiconductor element on the adherend, the generation of warp of the semiconductor element can be prevented.

Furthermore, according to the process for producing the semiconductor device of the invention, since the dicing tape-integrated film for semiconductor back surface is attached to the back surface of the semiconductor wafer and therefore, the step of attaching the film for semiconductor back surface alone is not required. Moreover, since the back surfaces of the semiconductor wafer and the semiconductor element are protected by the film for semiconductor back surface during the dicing of the semiconductor wafer and the picking-up of the semiconductor element formed by the dicing, damaging and the like can be prevented. Also, generation of warp on the semiconductor element can be prevented at the time when the semiconductor element is flip chip-connected onto the adherend. As a result, the flip chip type semiconductor device can be produced with improving the production yield.

DESCRIPTION OF REFERENCE NUMERALS AND SIGNS

1 Dicing Tape-Integrated Film for Semiconductor Back Surface
2 Film for Semiconductor Back Surface
3 Dicing Tape
31 Base Material
32 Pressure-Sensitive Adhesive Layer
33 Part Corresponding to Semiconductor Wafer-Attaching Part
4 Semiconductor Wafer
5 Semiconductor Chip
51 Bump Formed on the Circuit Face Side of Semiconductor Chip 5
6 Adherend
61 Conductive Material for Conjunction Attached to Connection Pad of Adherend 6

BEST MODE FOR CARRYING OUT THE INVENTION

Figure 1:
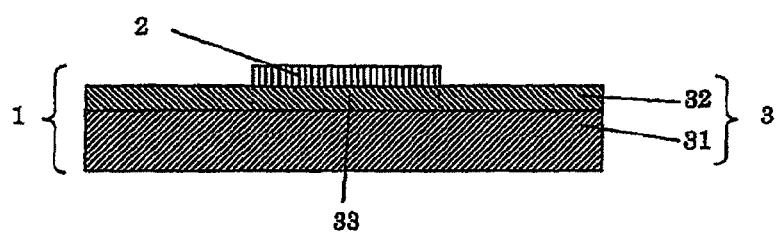
FIG. 1 is a cross-sectional schematic view showing one embodiment of a dicing tape-integrated film for semiconductor back surface of the invention.

Embodiments of the present invention are described with reference to FIG. 1 but the invention is not restricted to these embodiments. FIG. 1 is a cross-sectional schematic view showing one embodiment of a dicing tape-integrated film for semiconductor back surface according to the present embodiment. Incidentally, in the figures in the present specification, parts that are unnecessary for the description are not given, and there are parts shown by magnifying, minifying, etc. in order to make the description easy.
(Dicing Tape-Integrated Film for Semiconductor Back Surface)

As shown in FIG. 1, the dicing tape-integrated film 1 for semiconductor back surface (hereinafter sometimes also referred to as "dicing tape-integrated semiconductor back surface protective film", "film for semiconductor back surface with dicing tape", or "semiconductor back surface protective film with dicing tape") has a configuration including: the dicing tape 3 including the pressure-sensitive adhesive layer 32 formed on the base material 31, and, as formed on the pressure-sensitive adhesive layer 32, the film 2 for flip chip type semiconductor back surface (hereinafter sometimes referred to as "film for semiconductor back surface" or "semiconductor back surface protective film"). Also as shown in FIG. 1, the dicing tape-integrated film for semiconductor back surface of the invention may be so designed that the film 2 for semiconductor back surface is formed only on the part 33 corresponding to the semiconductor wafer-attaching part; however, the film for semiconductor back surface may be formed over the whole surface of the pressure-sensitive adhesive layer 32, or the film for semiconductor back surface may be formed on the part larger than the part 33 corresponding to the semiconductor wafer-attaching part but smaller than the whole surface of the pressure-sensitive adhesive layer 32. Incidentally, the surface of the film 2 for semiconductor back surface (surface to be attached to the back surface of wafer) may be protected with a separator or the like until the film is attached to wafer back surface.
(Film for Flip Chip Type Semiconductor Back Surface)

The film 2 for semiconductor back surface has a film shape. The film 2 for semiconductor back surface is usually in an uncured state (including a semi-cured state) in the embodiment of the dicing tape-integrated film for semiconductor back surface as a product and is thermally cured after the dicing tape-integrated film for semiconductor back surface is attached to the semiconductor wafer (details are described below).

The film 2 for semiconductor back surface according to the present embodiment has a property that the volume contraction ratio within a range of 23° C. to 165° C. at thermal curing of the film for flip chip type semiconductor back surface before thermal curing is 100 ppm/° C. to 400 ppm/° C. In the case where the volume contraction ratio is 100 ppm/° C. or more, even when the semiconductor element flip chip-connected on the adherend is thin (for example, a thickness of 300 μm or less, further a thickness of 200 μm or less), the warp can be effectively suppressed or prevented. In flip chip connection, after the semiconductor element is flip chip-bonded on the adherend, only a connection part between the adherend and the semiconductor element is encapsulated with an encapsulating material (such as an encapsulating resin called underfill). Further, the encapsulating resin is thermally cured, but a stress is applied to the semiconductor element due to the curing and contraction of the encapsulating material at that time and thus warp may be generated. However, the film 2 for semiconductor back surface according to the present embodiment is cured and contracted together with the encapsulating material at the thermal curing of the encapsulating material. On this occasion, since the volume contraction ratio is 100 ppm/° C. or more, it becomes possible to apply a stress also from the film 2 for semiconductor back surface to the semiconductor element and therefore, the stress originated from the curing and contraction of the encapsulating material can be offset or alleviated. As a result, the generation of warp of the semiconductor element can be suppressed or prevented. Moreover, since the volume contraction ratio is 400 ppm/° C. or less, an appropriate degree of contraction corresponding to the degree of contraction of the encapsulating material can be achieved. The above-mentioned volume contraction ratio of the film 2 for semiconductor back surface is preferably 150 ppm/° C. to 350 ppm/° C., more preferably 200 ppm/° C. to 350 ppm/° C.

Here, although the film for semiconductor back surface 2 may be a single layer or may be a laminated film in which a plurality of layers are laminated, in the case where the film for semiconductor back surface is a laminated film, the volume contraction ratio may be 100 ppm/° C. to 400 ppm/° C. as a whole of the laminated film. The foregoing volume contraction ratio of the film for semiconductor back surface can be controlled by suitably setting up the kind and content of the thermosetting resin, etc. For example, it can be controlled by the blending amount of the thermosetting resins different in linear thermal expansion coefficient. Incidentally, the volume contraction ratio of the film for semiconductor back surface can be measured according to the method described in Examples.

The film for semiconductor back surface is formed of at least a thermosetting resin and is preferably formed of at least a thermosetting resin and a thermoplastic resin. When the film is formed of at least a thermosetting resin, the film for semiconductor back surface can effectively exhibit a function as an adhesive layer.

Examples of the thermoplastic resin include natural rubber, butyl rubber, isoprene rubber, chloroprene rubber, an ethylene-vinyl acetate copolymer, an ethylene-acrylic acid copolymer, an ethylene-acrylic acid ester copolymer, a polybutadiene resin, a polycarbonate resin, a thermoplastic polyimide resin, a polyamide resin such as 6-nylon and 6,6-nylon, a phenoxy resin, an acrylic resin, a saturated polyester resin such as PET (polyethylene terephthalate) or PBT (polybutylene terephthalate), a polyamideimide resin, or a fluorine resin. The thermoplastic resin may be employed singly or in a combination of two or more kinds. Among these thermoplastic resins, an acrylic resin containing a small amount of ionic impurities, having high heat resistance and capable of securing reliability of a semiconductor element is especially preferable.

The acrylic resins are not particularly restricted, and examples thereof include polymers containing one kind or two or more kinds of esters of acrylic acid or methacrylic acid having a straight chain or branched alkyl group having 30 or less carbon atoms, preferably 4 to 18 carbon atoms, more preferably 6 to 10 carbon atoms, and especially 8 or 9 carbon atoms as component(s). Namely, in the invention, the acrylic resin has a broad meaning also including a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (lauryl group), a tridecyl group, a tetradecyl group, a stearyl group, and an octadecyl group.

Moreover, other monomers for forming the acrylic resins (monomers other than the alkyl esters of acrylic acid or methacrylic acid in which the alkyl group is one having 30 or less carbon atoms) are not particularly restricted, and examples thereof include carboxyl group-containing monomers such as acrylic acid, methacrylic acid, carboxyethyl acrylate, carboxylpentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl (meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl (meth)acrylate, 12-hydroxylauryl (meth)acrylate, and (4-hydroxymethylcyclohexyl)-methylacrylate; sulfonic acid group-containing monomers such as styrenesulfonic acid, allylsulfonic acid, 2-(meth)acrylamido-2-methylpropanesulfonic acid, (meth)acrylamidopropanesulfonic acid, sulfopropyl(meth)acrylate, and (meth)acryloyloxynaphthalenesulfonic acid; and phosphoric acid group-containing monomers such as 2-hydroxyethylacryloyl phosphate. In this regard, the (meth)acrylic acid means acrylic acid and/or methacrylic acid, (meth)acrylate means acrylate and/or methacrylate, (meth)acryl means acryl and/or methacryl, etc., which shall be applied over the whole specification.

Moreover, examples of the thermosetting resin include, in addition to an epoxy resin and a phenol resin, an amino resin, an unsaturated polyester resin, a polyurethane resin, a silicone resin and a thermosetting polyimide resin. The thermosetting resin may be employed singly or in a combination of two or more kinds. As the thermosetting resin, an epoxy resin containing only a small amount of ionic impurities which corrode a semiconductor element is suitable. Also, the phenol resin is suitably used as a curing agent of the epoxy resins.

The epoxy resin is not particularly restricted and, for example, a difunctional epoxy resin or a polyfunctional epoxy resin such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolak type epoxy resin, an o-cresol novolak type epoxy resin, a trishydroxyphenylmethane type epoxy resin and a tetraphenylolethane type epoxy resin, or an epoxy resin such as a hydantoin type epoxy resin, a trisglycidylisocyanurate type epoxy resin or a glycidylamine type epoxy resin may be used.

As the epoxy resin, among those exemplified above, a novolak type epoxy resin, a biphenyl type epoxy resin, a trishydroxyphenylmethane type epoxy resin, and a tetraphenylolethane type epoxy resin are preferable. This is because these epoxy resins have high reactivity with a phenol resin as a curing agent and are superior in heat resistance and the like.

Furthermore, the above-mentioned phenol resin acts as a curing agent of the epoxy resin, and examples thereof include novolak type phenol resins such as phenol novolak resins, phenol aralkyl resins, cresol novolak resins, tert-butylphenol novolak resins, and nonylphenol novolak resins; resol type phenol resins; and polyoxystyrenes such as poly-p-oxystyrene. The phenol resin may be employed singly or in a combination of two or more kinds. Among these phenol resins, phenol novolak resins and phenol aralkyl resins are especially preferable. This is because connection reliability of the semiconductor device can be improved.

The mixing proportion of the epoxy resin to the phenol resin is preferably made, for example, such that the hydroxyl group in the phenol resin becomes 0.5 equivalents to 2.0 equivalents per equivalent of the epoxy group in the epoxy resin component. It is more preferably 0.8 equivalents to 1.2 equivalents. Namely, when the mixing proportion is outside the range, a curing reaction does not proceed sufficiently, and the characteristics of the epoxy resin cured product tends to deteriorate.

The content of the thermosetting resin is preferably 5% by weight to 90% by weight, more preferably 10% by weight to 85% by weight, further preferably 15% by weight to 80% by weight based on the whole resin components of the film for semiconductor back surface. By controlling the content to 5% by weight or more, the degree of thermal curing contraction can be easily made 2% by volume or more. Moreover, at the thermal curing of the encapsulating resin, the film for semiconductor back surface can be sufficiently thermally cured and thus can be surely adhered and fixed to the back surface of the semiconductor element to produce a flip chip type semiconductor device exhibiting no peeling. On the other hand, by controlling the content to 90% by weight or less, warp of a package (PKG: a flip chip type semiconductor device) can be suppressed.

A thermal curing-accelerating catalyst for the epoxy resins and the phenol resins is not particularly restricted and can be suitably selected from known thermal curing-accelerating catalysts and used. The thermal curing-accelerating catalyst may be employed singly or in a combination of two or more kinds. As the thermal curing-accelerating catalyst, for example, an amine-based curing-accelerating catalyst, a phosphorus-based curing-accelerating catalyst, an imidazole-based curing-accelerating catalyst, a boron-based curing-accelerating catalyst, or a phosphorus-boron-based curing-accelerating catalyst can be used.

It is suitable that the film for semiconductor back surface is formed of a resin composition containing an epoxy resin and a phenol resin or a resin composition containing an epoxy resin, a phenol resin and an acrylic resin. Since these resins are small in ionic impurities and high in heat resistance, reliability of the semiconductor element can be secured.

It is important that the film 2 for semiconductor back surface has adhesiveness (close adhesion) to the back surface (non-circuit face) of the semiconductor wafer. The film 2 for semiconductor back surface can be, for example, formed of a resin composition containing an epoxy resin as a thermosetting resin. For the purpose of crosslinking the film 2 for semiconductor back surface to some extent beforehand, a polyfunctional compound capable of reacting with a molecular chain terminal functional group or the like of a polymer is preferably added as a crosslinking agent at the preparation. According to this, it is possible to enhance an adhesive characteristic under high temperatures and to improve heat resistance.

An adhesive force of the film for semiconductor back surface to the semiconductor wafer (23° C., a peeling angle of 180°, a peeling rate of 300 mm/min) preferably falls within a range of 0.5 N/20 mm to 15 N/20 mm, more preferably 0.7 N/20 mm to 10 N/20 mm. By controlling the adhesive force to 0.5 N/20 mm or more, the film is attached to the semiconductor wafer and the semiconductor element with excellent adhesiveness and can be prevented from generating lifting or the like. Moreover, at the dicing of the semiconductor wafer, the generation of chip fly can be also prevented. On the other hand, by controlling the adhesive force to 15 N/20 mm or less, the film can be easily peeled from the dicing tape.

The crosslinking agent is not particularly restricted and known crosslinking agents can be used. Specifically, for example, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned. As the crosslinking agent, an isocyanate-based crosslinking agent or an epoxy-based crosslinking agent is suitable. The crosslinking agent may be used singly or in a combination of two or more kinds.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl) isocyanurate, resorcin diglycidyl ether, and bisphenol-S-diglycidyl ether, and also epoxy-based resins having two or more epoxy groups in the molecule.

The amount of the crosslinking agent to be used is not particularly restricted and can be appropriately selected depending on the degree of the crosslinking. Specifically, it is preferable that the amount of the crosslinking agent to be used is usually 7 parts by weight or less (for example, 0.05 to 7 parts by weight) based on 100 parts by weight of the polymer component (particularly, a polymer having a functional group at the molecular chain end). When the amount of the crosslinking agent is larger than 7 parts by weight based on 100 parts by weight of the polymer component, the adhesive force is lowered, so that the case is not preferred. From the viewpoint of improving the cohesive force, the amount of the crosslinking agent is preferably 0.05 parts by weight or more based on 100 parts by weight of the polymer component.

In the invention, instead of the use of the crosslinking agent or together with the use of the crosslinking agent, it is also possible to perform a crosslinking treatment by irradiation with an electron beam, UV light, or the like.

The film for semiconductor back surface is preferably colored. Thereby, an excellent laser marking property and an excellent appearance property can be exhibited, and it becomes possible to make a semiconductor device having a value-added appearance property. As above, since the colored film for semiconductor back surface has an excellent marking property, marking can be performed to impart various kinds of information such as literal information and graphical information to the face on the non-circuit side of the semiconductor element or a semiconductor device using the semiconductor element by utilizing any of various marking methods such as a printing method and a laser marking method through the film of semiconductor back surface. Particularly, by controlling the color of coloring, it becomes possible to observe the information (for example, literal information and graphical information) imparted by marking with excellent visibility. Moreover, when the film for semiconductor back surface is colored, the dicing tape and the film for semiconductor back surface can be easily distinguished from each other, so that workability and the like can be enhanced. Furthermore, for example, as a semiconductor device, it is possible to classify products thereof by using different colors. In the case where the film for semiconductor back surface is colored (the case where the film is neither colorless nor transparent), the color shown by coloring is not particularly limited but, for example, is preferably dark color such as black, blue or red color, and black color is especially suitable.

In the present embodiment, dark color basically means a dark color having $L^*$, defined in $L^*a^*b^*$ color space, of 60 or smaller (0 to 60), preferably 50 or smaller (0 to 50), and more preferably 40 or smaller (0 to 40).

Moreover, black color basically means a black-based color having $L^*$, defined in $L^*a^*b^*$ color space, of 35 or smaller (0 to 35), preferably 30 or smaller (0 to 30), and more preferably 25 or smaller (0 to 25). In this regard, in the black color, each of $a^*$ and $b^*$, defined in the $L^*a^*b^*$ color space, can be suitably selected according to the value of $L^*$. For example, both of a* and b* are within the range of preferably −10 to 10, more preferably −5 to 5, and further preferably −3 to 3 (particularly 0 or about 0).

In the present embodiment, L*, a*, and b* defined in the L*a*b* color space can be determined by a measurement with a color difference meter (a trade name "CR-200" manufactured by Minolta Ltd; color difference meter). The L*a*b* color space is a color space recommended by the Commission Internationale de l'Eclairage (CIE) in 1976, and means a color space called CIE1976(L*a*b*) color space. Also, the L*a*b* color space is defined in Japanese Industrial Standards in JIS Z8729.

At coloring of the film for semiconductor back surface, according to an objective color, a colorant (coloring agent) can be used. As such a colorant, various dark-colored colorants such as black-colored colorants, blue-colored colorants, and red-colored colorants can be suitably used and black-colored colorants are more suitable. The colorant may be any of pigments and dyes. The colorant may be employed singly or in combination of two or more kinds. In this regard, as the dyes, it is possible to use any forms of dyes such as acid dyes, reactive dyes, direct dyes, disperse dyes, and cationic dyes. Moreover, also with regard to the pigments, the form thereof is not particularly restricted and can be suitably selected and used among known pigments.

In particular, when a dye is used as a colorant, the dye becomes in a state that it is homogeneously or almost homogeneously dispersed by dissolution in the film for semiconductor back surface, so that the film for semiconductor back surface (as a result, the dicing tape-integrated film for semiconductor back surface) having a homogeneous or almost homogeneous color density can be easily produced. Accordingly, when a dye is used as a colorant, the film for semiconductor back surface in the dicing tape-integrated film for semiconductor back surface can have a homogeneous or almost homogeneous color density and can enhance a marking property and an appearance property.

The black-colored colorant is not particularly restricted and can be, for example, suitably selected from inorganic black-colored pigments and black-colored dyes. Moreover, the black-colored colorant may be a colorant mixture in which a cyan-colored colorant (blue-green colorant), a magenta-colored colorant (red-purple colorant), and a yellow-colored colorant (yellow colorant) are mixed. The black-colored colorant may be employed singly or in a combination of two or more kinds. Of course, the black-colored colorant may be used in combination with a colorant of a color other than black.

Specific examples of the black-colored colorant include carbon black (such as furnace black, channel black, acetylene black, thermal black, or lamp black), graphite, copper oxide, manganese dioxide, azo-type pigments (such as azomethine azo black), aniline black, perylene black, titanium black, cyanine black, active charcoal, ferrite (such as non-magnetic ferrite or magnetic ferrite), magnetite, chromium oxide, iron oxide, molybdenum disulfide, a chromium complex, a composite oxide type black pigment, and an anthraquinone type organic black pigment.

In the invention, as the black-colored colorant, black-colored dyes such as C.I. Solvent Black 3, 7, 22, 27, 29, 34, 43, 70, C.I. Direct Black 17, 19, 22, 32, 38, 51, 71, C.I. Acid Black 1, 2, 24, 26, 31, 48, 52, 107, 109, 110, 119, 154, and C.I. Disperse Black 1, 3, 10, 24; black-colored pigments such as C.I. Pigment Black 1, 7; and the like can also be utilized.

As such black-colored colorants, for example, a trade name "Oil Black BY", a trade name "Oil Black BS", a trade name "Oil Black HBB", a trade name "Oil Black 803", a trade name "Oil Black 860", a trade name "Oil Black 5970", a trade name "Oil Black 5906", a trade name "Oil Black 5905" (manufactured by Orient Chemical Industries Co., Ltd.), and the like are commercially available.

Examples of colorants other than the black-colored colorant include cyan-colored colorants, magenta-colored colorants, and yellow-colored colorants. Examples of the cyan-colored colorants include cyan-colored dyes such as C.I. Solvent Blue 25, 36, 60, 70, 93, 95; C.I. Acid Blue 6 and 45; cyan-colored pigments such as C.I. Pigment Blue 1, 2, 3, 15, 15:1, 15:2, 15:3, 15:4, 15:5, 15:6, 16, 17, 17:1, 18, 22, 25, 56, 60, 63, 65, 66; C.I. Vat Blue 4, 60; and C.I. Pigment Green 7.

Moreover, among the magenta colorants, examples of magenta-colored dye include C.I. Solvent Red 1, 3, 8, 23, 24, 25, 27, 30, 49, 52, 58, 63, 81, 82, 83, 84, 100, 109, 111, 121, 122; C.I. Disperse Red 9; C.I. Solvent Violet 8, 13, 14, 21, 27; C.I. Disperse Violet 1; C.I. Basic Red 1, 2, 9, 12, 13, 14, 15, 17, 18, 22, 23, 24, 27, 29, 32, 34, 35, 36, 37, 38, 39, 40; C.I. Basic Violet 1, 3, 7, 10, 14, 15, 21, 25, 26, 27 and 28.

Among the magenta-colored colorants, examples of magenta-colored pigment include C.I. Pigment Red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, 245; C.I. Pigment Violet 3, 9, 19, 23, 31, 32, 33, 36, 38, 43, 50; C.I. Vat Red 1, 2, 10, 13, 15, 23, 29 and 35.

Moreover, examples of the yellow-colored colorants include yellow-colored dyes such as C.I. Solvent Yellow 19, 44, 77, 79, 81, 82, 93, 98, 103, 104, 112, and 162; yellow-colored pigments such as C.I. Pigment Orange 31, 43; C.I. Pigment Yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, 195; C.I. Vat Yellow 1, 3, and 20.

Various colorants such as cyan-colored colorants, magenta-colored colorants, and yellow-colorant colorants may be employed singly or in a combination of two or more kinds, respectively. In this regard, in the case where two or more kinds of various colorants such as cyan-colored colorants, magenta-colored colorants, and yellow-colorant colorants are used, the mixing ratio (or blending ratio) of these colorants is not particularly restricted and can be suitably selected according to the kind of each colorant, an objective color, and the like.

In the case where the film 2 for semiconductor back surface is colored, the colored form is not particularly restricted. The film for semiconductor back surface may be, for example, a single-layer film-shaped article added with a coloring agent. Moreover, the film may be a laminated film where at least a resin layer formed of at least a thermosetting resin and a coloring agent layer are laminated. In this regard, in the case where the film 2 for semiconductor back surface is a laminated film of the resin layer and the coloring agent layer, the film 2 for semiconductor back surface in the laminated form preferably has a laminated form of a resin layer/a coloring agent layer/a resin layer. In this case, two resin layers at both sides of the coloring agent layer may be resin layers having the same composition or may be resin layers having different composition.

Into the film 2 for semiconductor back surface, other additives can be suitably blended according to the necessity. Examples of the other additives include an extender, an antiaging agent, an antioxidant, and a surfactant, in addition to a filler, a flame retardant, a silane-coupling agent, and an ion-trapping agent.

The filler may be any of an inorganic filler and an organic filler but an inorganic filler is suitable. By blending a filler such as an inorganic filler, imparting of electric conductivity to the film for semiconductor back surface, improvement of the thermal conductivity, control of elastic modulus, and the like can be achieved. In this regard, the film 2 for semiconductor back surface may be electrically conductive or non-conductive. Examples of the inorganic filler include various inorganic powders composed of silica, clay, gypsum, calcium carbonate, barium sulfate, alumina oxide, beryllium oxide, ceramics such as silicone carbide and silicone nitride, metals or alloys such as aluminum, copper, silver, gold, nickel, chromium, lead, tin, zinc, palladium, and solder, carbon, and the like. The filler may be employed singly or in a combination of two or more kinds. Particularly, the filler is suitably silica and more suitably fused silica. Herein, the average particle diameter of the inorganic filler is preferably within a range of from 0.1 μm to 80 μm. The average particle diameter of the inorganic filler can be measured, for example, by a laser diffraction-type particle size distribution measurement apparatus.

The blending amount of the filler (particularly, inorganic filler) is preferably 80 parts by weight or less (0 part by weight to 80 parts by weight), particularly preferably 0 part by weight to 70 parts by weight based on 100 parts by weight of the organic resin components.

Examples of the flame retardant include antimony trioxide, antimony pentoxide, and brominated epoxy resins. The flame retardant may be employed singly or in a combination of two or more kinds. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. The silane coupling agent may be employed singly or in a combination of two or more kinds. Examples of the ion-trapping agent include hydrotalcites and bismuth hydroxide. The ion-trapping agent may be employed singly or in a combination of two or more kinds.

The film 2 for semiconductor back surface can be, for example, formed by utilizing a commonly used method including mixing a thermosetting resin such as an epoxy resin and, if necessary, a thermoplastic resin such as an acrylic resin and optional solvent and other additives to prepare a resin composition, followed by forming it to a film-shaped layer. Specifically, a film-shaped layer (adhesive layer) as the film for semiconductor back surface can be formed, for example, by a method including applying the resin composition on the pressure-sensitive adhesive layer 32 of the dicing tape; a method including applying the resin composition on an appropriate separator (such as release paper) to form a resin layer (or an adhesive layer) and then transferring (transcribing) it on the pressure-sensitive adhesive layer 32; or the like. In this regard, the resin composition may be a solution or a dispersion.

Incidentally, in the case where the film 2 for semiconductor back surface is formed of a resin composition containing a thermosetting resin such as an epoxy resin, the film for semiconductor back surface is in a state that the thermosetting resin is uncured or partially cured at a stage before the film is applied to a semiconductor wafer. In this case, after it is applied to the semiconductor wafer (specifically, usually, at the time when the encapsulating material is cured in the flip chip bonding step), the thermosetting resin in the film for semiconductor back surface is completely or almost completely cured.

As above, since the film for semiconductor back surface is in a state that the thermosetting resin is uncured or partially cured even when the film contains the thermosetting resin, the gel fraction of the film for semiconductor back surface is not particularly restricted but is, for example, suitably selected from the range of 50% by weight or less (0 to 50% by weight) and is preferably 30% by weight or less (0 to 30% by weight) and particularly preferably 10% by weight or less (0 to 10% by weight). The gel fraction of the film for semiconductor back surface can be measured by the following measuring method.

<Gel Fraction Measuring Method>

About 0.1 g of a sample is sampled from the film 2 for semiconductor back surface and precisely weighed (weight of sample) and, after the sample is wrapped in a mesh-type sheet, it is immersed in about 50 mL of toluene at room temperature for 1 week. Thereafter, a solvent-insoluble matter (content in the mesh-type sheet) is taken out of the toluene and dried at 130° C. for about 2 hours, the solvent-insoluble matter after drying is weighed (weight after immersion and drying), and a gel fraction (% by weight) is then calculated according to the following expression (a).

Gel fraction (% by weight)=[(Weight after immersion and Drying)/(Weight of sample)]×100    (a)

The gel fraction of the film for semiconductor back surface can be controlled by the kind and content of the resin components and the kind and content of the crosslinking agent and besides, heating temperature, heating time and the like.

In the invention, in the case where the film for semiconductor back surface is a film-shaped article formed of a resin composition containing a thermosetting resin such as an epoxy resin, close adhesiveness to a semiconductor wafer can be effectively exhibited.

Incidentally, since cutting water is used in the dicing step of the semiconductor wafer, the film for semiconductor back surface absorbs moisture to have a moisture content of a normal state or more in some cases. When flip chip bonding is performed with still maintaining such a high moisture content, water vapor remains at the adhesion interface between the film 2 for semiconductor back surface and the semiconductor wafer or its processed body (semiconductor) and lifting is generated in some cases. Therefore, by constituting the film for semiconductor back surface as a configuration in which a core material having a high moisture permeability is provided on each surface thereof, water vapor diffuses and thus it becomes possible to avoid such a problem. From such a viewpoint, a multilayered structure in which the film 2 for semiconductor back surface is formed at one surface or both surfaces of the core material may be used as the film for semiconductor back surface. Examples of the core material include films (e.g., polyimide films, polyester films, polyethylene terephthalate films, polyethylene naphthalate films, polycarbonate films, etc.), resin substrates reinforced with a glass fiber or a plastic nonwoven fiber, silicon substrates, and glass substrates.

The thickness (total thickness in the case of a laminated film) of the film 2 for semiconductor back surface is not particularly limited, but is preferably 10 μm to 40 μm, more preferably 20 μm to 30 μm. By controlling the thickness of the film 2 for semiconductor back surface to 10 μm or more, the warp can be more effectively suppressed or prevented. Moreover, by controlling the thickness to 40 μm or less, the generation of the warp to the reverse side can be further suppressed or prevented. Also, by controlling the thickness to 40

μm or less, it becomes possible to thin a semiconductor device composed of the semiconductor element flip chip-mounted on the adherend.

The tensile storage elastic modulus of the film 2 for semiconductor back surface in an uncured state at 23° C. is preferably 1 GPa or more (e.g., 1 GPa to 50 GPa), more preferably 2 GPa or more, and particularly, 3 GPa or more is suitable. When the tensile storage elastic modulus is 1 GPa or more, the attachment of the film for semiconductor back surface to a support can be effectively suppressed or prevented at the time when the film 2 for semiconductor back surface is placed on the support and transportation and the like are performed after the semiconductor chip is peeled from the pressure-sensitive adhesive layer 32 of the dicing tape together with the film 2 for semiconductor back surface. In this regard, the support is, for example, a top tape, a bottom tape, and the like in a carrier tape.

Here, the film 2 for semiconductor back surface may be either a single layer or a laminated film where a plurality of layers are laminated. In the case of the laminated film, the tensile storage elastic modulus at 23° C. is sufficiently 1 GPa or more (e.g., 1 GPa to 50 GPa) as the whole laminated film in an uncured state. Also the tensile storage elastic modulus (23° C.) of the film for semiconductor back surface in an uncured state can be controlled by suitably setting up the kind and content of the resin components (thermoplastic resin and/or thermosetting resin) or the kind and content of a filler such as a silica filler. In the case where the film 2 for semiconductor back surface is a laminated film where a plurality of layers are laminated (in the case where the film for semiconductor back surface has a form of the laminated layer), as the laminated layer form, for example, a laminated form composed of a wafer adhesive layer and a laser marking layer can be exemplified. Moreover, between the wafer adhesive layer and the laser marking layer, other layers (an intermediate layer, a light-shielding layer, a reinforcing layer, a colored layer, a base material layer, an electromagnetic wave-shielding layer, a heat conductive layer, a pressure-sensitive adhesive layer, etc.) may be provided. In this regard, the wafer adhesive layer is a layer which exhibits an excellent close adhesiveness (adhesive property) to a wafer and a layer which comes into contact with the back surface of a wafer. On the other hand, the laser marking layer is a layer which exhibits an excellent laser marking property and a layer which is utilized at the laser marking on the back surface of a semiconductor chip.

The tensile storage elastic modulus is determined by preparing the film 2 for semiconductor back surface in an uncured state without lamination onto the dicing tape 3 and measuring elastic modulus in a tensile mode under conditions of a sample width of 10 mm, a sample length of 22.5 mm, a sample thickness of 0.2 mm, a frequency of 1 Hz, and a temperature elevating rate of 10° C./minute under a nitrogen atmosphere at a prescribed temperature (23° C.) using a dynamic viscoelasticity measuring apparatus "Solid Analyzer RS A2" manufactured by Rheometrics Co. Ltd. and the measured elastic modulus is regarded as a value of tensile storage elastic modulus obtained.

The film 2 for semiconductor back surface after thermal curing preferably has a tensile storage modulus at 23° C. of 1 GPa to 5 GPa, more preferably 1.5 GPa to 4.5 GPa, further preferably 2.0 GPa to 4.0 GPa. When the tensile storage modulus after the thermal curing is 1 GPa or more, the warp can be more effectively suppressed or prevented. Moreover, when the tensile storage modulus after the thermal curing is 5 GPa or less, the generation of the warp to the reverse side can be further suppressed or prevented.

Here, although the film 2 for semiconductor back surface may be a single layer or may be a laminated film in which a plurality of layers are laminated, in the case of the laminated film, the tensile storage modulus at 23° C. after the thermal curing may falls within a range of 1 GPa to 5 GPa as a whole of the laminated film. Also, the foregoing tensile storage modulus of the film for semiconductor back surface at 23° C. after the thermal curing can be controlled by suitably setting up the kind and content of the resin components (thermoplastic resin and/or thermosetting resin), the kind and content of a filler such as a silica filler, and the like.

Incidentally, the tensile storage modulus at 23° C. after the thermal curing is determined by preparing the thermally cured film 2 for semiconductor back surface without lamination to the dicing tape 3 and measuring an elastic modulus in a tensile mode under conditions of a sample width of 10 mm, a sample length of 22.5 mm, a sample thickness of 0.2 mm, a frequency of 1 Hz and a temperature elevating rate of 10° C./min under a nitrogen atmosphere at a prescribed temperature (23° C.) using a dynamic viscoelasticity measuring apparatus "Solid Analyzer RS A2" manufactured by Rheometrics Co., Ltd. and is taken as a value of obtained tensile storage modulus.

Preferably, the film 2 for semiconductor back surface is protected with a separator (release liner) on at least one surface thereof (not shown in figures). For example, in the dicing tape-integrated film 1 for semiconductor back surface, a separator may be provided on at least one surface of the film for semiconductor back surface. On the other hand, in the film for semiconductor back surface not integrated with a dicing tape, a separator may be provided on one surface or both surfaces of the film for semiconductor back surface. The separator has a function as a protective material for protecting the film for semiconductor back surface until it is practically used. Further, in the dicing tape-integrated film 1 for semiconductor back surface, the separator may further serve as the supporting base material in transferring the film 2 for semiconductor back surface onto the pressure-sensitive adhesive layer 32 of the base material of the dicing tape. The separator is peeled off when a semiconductor wafer is attached onto the film for semiconductor back surface. As the separator, a film of polyethylene or polypropylene, as well as a plastic film (such as polyethylene terephthalate), a paper or the like whose surface is coated with a releasing agent such as a fluorine-based releasing agent or a long-chain alkyl acrylate-based releasing agent can also be used. The separator can be formed by a conventionally known method. Moreover, the thickness or the like of the separator is not particularly restricted.

In case where the film 2 for semiconductor back surface is not laminated with the dicing tape 3, the film 2 for semiconductor back surface may be wound up along with one separator having a release layer on both sides thereof, into a roll in which the film 2 is protected with the separator having a release layer on both surfaces thereof; or the film 2 may be protected with a separator having a release layer on at least one surface thereof.

Moreover, the light transmittance with a visible light (visible light transmittance, wavelength: 400 to 800 nm) in the film 2 for semiconductor back surface is not particularly restricted but is, for example, preferably in the range of 20% or less (0 to 20%), more preferably 10% or less (0 to 10%), and particularly preferably 5% or less (0 to 5%). When the film 2 for semiconductor back surface has a visible light transmittance of more than 20%, there is a concern that the transmission of the light may adversely influence the semiconductor element. The visible light transmittance (%) can be controlled by the kind and content of the resin components of the film 2 for semiconductor back surface, the kind and content of the coloring agent (such as pigment or dye), the content of the inorganic filer, and the like.

The visible light transmittance (%) of the film 2 for semiconductor back surface can be determined as follows. Namely, a film 2 for semiconductor back surface having a thickness (average thickness) of 20 μm itself is prepared. Then, the film 2 for semiconductor back surface is irradiated with a visible light having a wavelength of 400 to 800 nm in a prescribed intensity [apparatus: a visible light generating apparatus manufactured by Shimadzu Corporation [trade name "ABSORPTION SPECTRO PHOTOMETER"], and the intensity of transmitted visible light is measured. Further, the visible light transmittance (%) can be determined based on intensity change before and after the transmittance of the visible light through the film 2 for semiconductor back surface. In this regard, it is also possible to derive visible light transmittance (%; wavelength: 400 to 800 nm) of the film 2 for semiconductor back surface having a thickness of 20 μm from the value of the visible light transmittance (%; wavelength: 400 to 800 nm) of the film 2 for semiconductor back surface whose thickness is not 20 μm. In the invention, the visible light transmittance (%) is determined in the case of the film 2 for semiconductor back surface having a thickness of 20 μm, but the film for semiconductor back surface according to the invention is not limited to one having a thickness of 20 μm.

Moreover, as the film 2 for semiconductor back surface, one having lower moisture absorbance is more preferred. Specifically, the moisture absorbance is preferably 1% by weight or less and more preferably 0.8% by weight or less. By regulating the moisture absorbance to 1% by weight or less, the laser marking property can be enhanced. Moreover, for example, the generation of voids between the film 2 for semiconductor back surface and the semiconductor element can be suppressed or prevented in the reflow step. The moisture absorbance is a value calculated from a weight change before and after the film 2 for semiconductor back surface is allowed to stand under an atmosphere of a temperature of 85° C. and a humidity of 85% RH for 168 hours. In the case where the film 2 for semiconductor back surface is formed of a resin composition containing a thermosetting resin, the moisture absorbance means a value obtained when the film after thermal curing is allowed to stand under an atmosphere of a temperature of 85° C. and a humidity of 85% RH for 168 hours. Moreover, the moisture absorbance can be regulated, for example, by changing the amount of the inorganic filler to be added.

Moreover, as the film 2 for semiconductor back surface, one having a smaller ratio of volatile matter is more preferred. Specifically, the ratio of weight decrease (weight decrease ratio) of the film 2 for semiconductor back surface after heating treatment is preferably 1% by weight or less and more preferably 0.8% by weight or less. The conditions for the heating treatment are, for example, a heating temperature of 250° C. and a heating time of 1 hour. By regulating the weight decrease ratio to 1% by weight or less, the laser marking property can be enhanced. Moreover, for example, the generation of cracks in a flip chip type semiconductor device can be suppressed or prevented in the reflow step. The weight decrease ratio can be regulated, for example, by adding an inorganic substance capable of reducing the crack generation at lead-free solder reflow. In the case where the film 2 for semiconductor back surface is formed of a resin composition containing a thermosetting resin component, the weight decrease ratio is a value obtained when the film for semiconductor back surface after thermal curing is heated under conditions of a temperature of 250° C. and a heating time of 1 hour.

(Dicing Tape)

The dicing tape 3 includes a base material 31 and a pressure-sensitive adhesive layer 32 formed on the base material 31. Thus, it is sufficient that the dicing tape 3 has a configuration in which the base material 31 and the pressure-sensitive adhesive layer 32 are laminated. The base material (supporting base material) can be used as a supporting material for the pressure-sensitive adhesive layer and the like. The base material 31 preferably has a radiation ray-transmitting property. As the base material 31, for example, suitable thin materials, e.g., paper-based base materials such as paper; fiber-based base materials such as fabrics, non-woven fabrics, felts, and nets; metal-based base materials such as metal foils and metal plates; plastic base materials such as plastic films and sheets; rubber-based base materials such as rubber sheets; foamed bodies such as foamed sheets; and laminates thereof [particularly, laminates of plastic based materials with other base materials, laminates of plastic films (or sheets) each other, etc.] can be used. In the invention, as the base material, plastic base materials such as plastic films and sheets can be suitably employed. Examples of raw materials for such plastic materials include olefinic resins such as polyethylene (PE), polypropylene (PP), and ethylene-propylene copolymers; copolymers using ethylene as a monomer component, such as ethylene-vinyl acetate copolymers (EVA), ionomer resins, ethylene-(meth)acrylic acid copolymers, and ethylene-(meth)acrylic acid ester (random, alternating) copolymers; polyesters such as polyethylene terephthalate (PET), polyethylene naphthalate (PEN), and polybutylene terephthalate (PBT); acrylic resins; polyvinyl chloride (PVC); polyurethanes; polycarbonates; polyphenylene sulfide (PPS); amide-based resins such as polyamides (Nylon) and whole aromatic polyamides (aramide); polyether ether ketones (PEEK); polyimides; polyetherimides; polyvinylidene chloride; ABS (acrylonitrile-butadiene-styrene copolymers); cellulose-based resins; silicone resins; and fluorinated resins.

In addition, the materials for the base material 31 include polymers such as crosslinked materials of the foregoing resins. The plastic films may be used without stretching or may be used after subjected to a uniaxial or biaxial stretching treatment, if necessary. According to the resin sheet to which thermal contraction property is imparted by a stretching treatment or the like, the adhered area between the pressure-sensitive adhesive layer 32 and the film for semiconductor back surface 2 is reduced by thermal contraction of the base material 31 after dicing and thus the recovery of the semiconductor chip can be facilitated.

A commonly used surface treatment, e.g., a chemical or physical treatment such as a chromate treatment, ozone exposure, flame exposure, exposure to high-voltage electric shock, or an ionized radiation treatment, or a coating treatment with an undercoating agent e.g., a pressure-sensitive adhesive substance to be mentioned later) may be applied onto the surface of the base material 31 in order to enhance close adhesiveness with the adjacent layer, holding properties, and the like.

As the base material 31, the same kind or different kinds of materials can be suitably selected and used and, if necessary, several kinds of materials can be blended and used. Moreover, to the base material 31, for imparting antistatic ability, a vapor deposition layer of a conductive substance having a thickness of about 30 to 500 angstrom, which is composed of a metal, alloy or an oxide thereof, can be formed on the base material 31. The base material 31 may be a single layer or a multilayer of two or more thereof.

The thickness (total thickness in the case of the laminated layer) of the base material 31 is not particularly restricted and can be appropriately selected depending on strength, flexibility, intended purpose of use, and the like. For example, the thickness is generally 1,000 μm or less (e.g., 1 μm to 1,000 μm), preferably 10 μm to 500 μm, further preferably 20 μm to 300 μm, and particularly preferably about 30 μm to 200 μm but is not limited thereto.

Incidentally, the base material 31 may contain various additives (a coloring agent, a filler, a plasticizer, an antiaging agent, an antioxidant, a surfactant, a flame retardant, etc.) within the range where the advantages and the like of the invention are not impaired.

The pressure-sensitive adhesive layer 32 is formed of a pressure-sensitive adhesive and has a pressure-sensitive adhesiveness. Not specifically defined, the pressure-sensitive adhesive may be suitably selected from known pressure-sensitive adhesives. Concretely, as the pressure-sensitive adhesive, for example, those having the above-mentioned characteristics are suitably selected from known pressure-sensitive adhesives such as acrylic pressure-sensitive adhesives, rubber-based pressure-sensitive adhesives, vinyl alkyl ether-based pressure-sensitive adhesives, silicone-based pressure-sensitive adhesives, polyester-based pressure-sensitive adhesives, polyamide-based pressure-sensitive adhesives, urethane-based pressure-sensitive adhesives, fluorine-based pressure-sensitive adhesives, styrene-diene block copolymer-based pressure-sensitive adhesives, and creep characteristics-improved pressure-sensitive adhesives prepared by incorporating a thermofusible resin having a melting point of not higher than 200° C. to the above-mentioned pressure-sensitive adhesive (for example, see JP-A 56-61468, JP-A-61-174857, JP-A-63-17981, JP-A-56-13040, herein incorporated by reference), and are used herein. As the pressure-sensitive adhesive, also usable here are radiation-curable pressure-sensitive adhesives (or energy ray-curable pressure-sensitive adhesives) and thermally expandable pressure-sensitive adhesives. One or more such pressure-sensitive adhesives may be used here either singly or as combined.

As the pressure-sensitive adhesive, preferred for use herein are acrylic pressure-sensitive adhesives and rubber-based pressure-sensitive adhesives, and more preferred are acrylic pressure-sensitive adhesives. Examples of the acrylic pressure-sensitive adhesives include those comprising, as the base polymer, an acrylic polymer (homopolymer or copolymer) of one or more alkyl(meth)acrylates as monomer component(s).

The alkyl(meth)acrylate for the acrylic pressure-sensitive adhesive includes, for example, methyl(meth)acrylate, ethyl (meth)acrylate, propyl (meth)acrylate, isopropyl(meth)acrylate, butyl(meth)acrylate, isobutyl(meth)acrylate, s-butyl (meth)acrylate, t-butyl(meth)acrylate, pentyl(meth)acrylate, hexyl (meth)acrylate, heptyl(meth)acrylate, octyl(meth) acrylate, 2-ethylhexyl(meth)acrylate, isooctyl(meth)acrylate, nonyl(meth)acrylate, isononyl(meth)acrylate, decyl (meth)acrylate, isodecyl(meth)acrylate, undecyl(meth)acrylate, dodecyl (meth)acrylate, tridecyl(meth)acrylate, tetradecyl(meth)acrylate, pentadecyl (meth)acrylate, hexadecyl (meth)acrylate, heptadecyl(meth)acrylate, octadecyl (meth) acrylate, nonadecyl(meth)acrylate, eicosyl(meth)acrylate, etc. As the alkyl (meth)acrylate, preferred are those in which the alkyl group has from 4 to 18 carbon atoms. In the alkyl (meth)acrylate, the alkyl group may be linear or branched.

The acrylic polymer may contain, if desired, a unit corresponding to any other monomer component copolymerizable with the above-mentioned alkyl (meth)acrylate (copolymerizable monomer component), for the purpose of improving the cohesive force, the heat resistance and the crosslinkability thereof. The copolymerizable monomer component includes, for example, carboxyl group-containing monomers such as (meth)acrylic acid (acrylic acid, methacrylic acid), carboxyethyl acrylate, carboxypentyl acrylate, itaconic acid, maleic acid, fumaric acid, crotonic acid; acid anhydride group-containing monomers such as maleic anhydride, itaconic anhydride; hydroxyl group-containing monomers such as hydroxyethyl (meth)acrylate, hydroxypropyl(meth)acrylate, hydroxybutyl(meth)acrylate, hydroxyhexyl(meth)acrylate, hydroxyoctyl(meth)acrylate, hydroxydecyl (meth)acrylate, hydroxylauryl(meth)acrylate, (4-hydroxymethylcyclohexyl) methyl methacrylate; sulfonic acid group-containing monomers such as styrenesulfonic acid, allylsulfonic acid, 2-(meth)acrylamide-2-methylpropanesulfonic acid, (meth) acrylamide-propanesulfonic acid, sulfopropyl(meth)acrylate, (meth)acryloyloxynaphthalenesulfonic acid; phosphoric acid group-containing monomers such as 2-hydroxyethyl acryloylphosphate; (N-substituted) amide monomers such as (meth)acrylamide, N,N-dimethyl(meth)acrylamide, N-butyl (meth)acrylamide, N-methylol(meth)acrylamide, N-methylolpropane(meth)acrylamide; aminoalkyl (meth)acrylate monomers such as aminoethyl(meth)acrylate, N,N-dimethylaminoethyl (meth)acrylate, t-butylaminoethyl(meth)acrylate; alkoxyalkyl(meth)acrylate monomers such as methoxyethyl(meth)acrylate, ethoxyethyl(meth)acrylate; cyanoacrylate monomers such as acrylonitrile, methacrylonitrile; epoxy group-containing acrylic monomers such as glycidyl(meth)acrylate; styrene monomers such as styrene, α-methylstyrene; vinyl ester monomers such as vinyl acetate, vinyl propionate; olefin monomers such as isoprene, butadiene, isobutylene; vinyl ether monomers such as vinyl ether; nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarbonamides, N-vinylcaprolactam; maleimide monomers such as N-cyclohexylmaleimide, N-isopropylmaleimide, N-laurylmaleimide, N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, N-laurylitaconimide; succinimide monomers such as N-(meth)acryloyloxymethylenesuccinimide, N-(meth)acryloyl-6-oxyhexamethylenesuccinimide, N-(meth)acryloyl-8-oxyoctamethylenesuccinimide; acryl glycolate monomers such as polyethylene glycol (meth)acrylate, polypropylene glycol (meth)acrylate, methoxyethylene glycol (meth)acrylate, methoxypolypropylene glycol (meth)acrylate; acrylate monomers having a hetero ring, a halogen atom, a silicone atom or the like such as tetrahydrofurfuryl(meth)acrylate, fluoro(meth)acrylate, silicone (meth)acrylate; polyfunctional monomers such as hexanediol di(meth)acrylate, (poly)ethylene glycol di(meth)acrylate, (poly)propylene glycol di(meth) acrylate, neopentylglycol di(meth)acrylate, pentaerythritol di(meth)acrylate, trimethylolpropane tri(meth)acrylate, pentaerythritol tri(meth)acrylate, dipentaerythritol hexa(meth) acrylate, epoxyacrylate, polyester acrylate, urethane acrylate, divinylbenzene, butyl di(meth)acrylate, hexyl di(meth)acrylate, etc. One or more these copolymerizable monomer components may be used here either singly or as combined.

The radiation-curable pressure-sensitive adhesive (or energy ray-curable pressure-sensitive adhesive) (composition) usable in the invention includes, for example, an internal-type radiation-curable pressure-sensitive adhesive comprising, as the base polymer, a polymer having a radical-reactive carbon-carbon double bond in the polymer side chain, main chain or main chain terminal, and a radiation-curable pressure-sensitive adhesive prepared by incorporating a UV-curable monomer component or oligomer component in a pressure-sensitive adhesive. The thermally expandable pressure-sensitive adhesive also usable here includes, for example, those comprising a pressure-sensitive adhesive and a foaming agent (especially thermally expandable microspheres).

In the invention, the pressure-sensitive adhesive layer 32 may contain various additives (e.g., a tackifying resin, a coloring agent, a thickener, an extender, a filler, a plasticizer, an antiaging agent, an antioxidant, a surfactant, a crosslinking agent, etc.) within the range where the advantages of the invention are not impaired.

The crosslinking agent is not particularly restricted and known crosslinking agents can be used. Specifically, as the crosslinking agent, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned, and isocyanate-based crosslinking agents and epoxy-based crosslinking agents are suitable. The crosslinking agent may be employed singly or in a combination of two or more kinds. Incidentally, the amount of the crosslinking agent to be used is not particularly restricted.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl) isocyanurate, resorcin diglycidyl ether, and bisphenol-S-diglycidyl ether, and also epoxy-based resins having two or more epoxy groups in the molecule.

In place of using the crosslinking agent or along with the crosslinking agent in the invention, the pressure-sensitive adhesive layer may be crosslinked through irradiation with electron rays or UV rays.

The pressure-sensitive adhesive layer 32 can be, for example, formed by utilizing a commonly used method including mixing a pressure-sensitive adhesive and optional solvent and other additives and then shaping the mixture into a sheet-like layer. Specifically, for example, there may be mentioned a method including applying a mixture containing a pressure-sensitive adhesive and optional solvent and other additives on the base material 31; a method including applying the foregoing mixture on an appropriate separator (such as a release paper) to form a pressure-sensitive adhesive layer 32 and then transferring (transcribing) it on the base material 31; or the like.

Not specifically defined, the thickness of the pressure-sensitive adhesive layer 32 may be, for example, from 5 µm to 300 µm (preferably from 5 µm to 200 µm, more preferably from 5 µm to 100 µM, even more preferably from 7 µm to 50 µm) or so. When the thickness of the pressure-sensitive adhesive layer 32 falls within the range, then the layer can exhibit a suitable pressure-sensitive adhesive force. The pressure-sensitive adhesive layer 32 may be a single layer or a multilayer.

The adhesive force of the pressure-sensitive adhesive layer 32 of the dicing tape 3 to the film 2 for flip chip type semiconductor back surface (23° C., peeling angle of 180 degrees, peeling rate of 300 mm/min) is preferably within a range of from 0.02 N/20 mm to 10 N/20 mm, more preferably from 0.05 N/20 mm to 5 N/20 mm. When the adhesive force is at least 0.02 N/20 mm, then the semiconductor chips may be prevented from flying away in dicing semiconductor wafer. On the other hand, when the adhesive force is at most 10 N/20 mm, then it facilitates peeling of semiconductor chips in picking up them, and prevents the pressure-sensitive adhesive from remaining Incidentally, in the invention, the film 2 for flip-chip type semiconductor back surface or the dicing tape-integrated film 1 for semiconductor back surface can be made to have an antistatic function. Owing to this configuration, the circuit can be prevented from breaking down due to the generation of electrostatic energy at the time adhesion and at the time of peeling thereof or due to charging of a semiconductor wafer or the like by the electrostatic energy. Imparting of the antistatic function can be performed by an appropriate manner such as a method of adding an antistatic agent or a conductive substance to the base material 31, the pressure-sensitive adhesive layer 32, and the film 2 for semiconductor back surface, or a method of providing a conductive layer composed of a charge-transfer complex, a metal film, or the like onto the base material 31. As these methods, a method in which an impurity ion having a fear of changing quality of the semiconductor wafer is difficult to generate is preferable. Examples of the conductive substance (conductive filler) to be blended for the purpose of imparting conductivity, improving thermal conductivity, and the like include a sphere-shaped, a needle-shaped, or a flake-shaped metal powder of silver, aluminum, gold, copper, nickel, a conductive alloy, or the like; a metal oxide such as alumina; amorphous carbon black, and graphite. However, the film 2 for semiconductor back surface is preferably non-conductive from the viewpoint of having no electric leakage.

Moreover, the film 2 for flip-chip type semiconductor back surface or the dicing tape-integrated film 1 for semiconductor back surface may be formed in a form where it is wound as a roll or may be formed in a form where the sheet (film) is laminated. For example, in the case where the film has the form where it is wound as a roll, the film is wound as a roll in a state that the film 2 for semiconductor back surface or the laminate of the film 2 for semiconductor back surface and the dicing tape 3 is protected by a separator according to needs, whereby the film can be prepared as a film 2 for semiconductor back surface or a dicing tape-integrated film 1 for semiconductor back surface in a state or form where it is wound as a roll. In this regard, the dicing tape-integrated film 1 for semiconductor back surface in the state or form where it is wound as a roll may be constituted by the base material 31, the pressure-sensitive adhesive layer 32 formed on one surface of the base material 31, the film 2 for semiconductor back surface formed on the pressure-sensitive adhesive layer 32, and a releasably treated layer (rear surface treated layer) formed on the other surface of the base material 31.

Incidentally, the thickness of the dicing tape-integrated film 1 for semiconductor back surface (total thickness of the thickness of the film for semiconductor back surface and the thickness of the dicing tape including the base material 31 and the pressure-sensitive adhesive layer 32) can be, for example, selected from the range of 8 μm to 1,500 μm, and it is preferably from 20 μm to 850 μm, more preferably 31 μm to 500 μm, and particularly preferably 47 μm to 330 μm.

In this regard, in the dicing tape-integrated film 1 for semiconductor back surface, by controlling the ratio of the thickness of the film 2 for semiconductor back surface to the thickness of the pressure-sensitive adhesive layer 32 of the dicing tape 3 or the ratio of the thickness of the film 2 for semiconductor back surface to the thickness of the dicing tape (total thickness of the base material 31 and the pressure-sensitive adhesive layer 32), a dicing property at the dicing step, a picking-up property at the picking-up step, and the like can be improved and the dicing tape-integrated film 1 for semiconductor back surface can be effectively utilized from the dicing step of the semiconductor wafer to the flip chip bonding step of the semiconductor chip.

(Producing Method of Dicing Tape-Integrated Film for Semiconductor Back Surface)

The producing method of the dicing tape-integrated film for semiconductor back surface according to the present embodiment is described while using the dicing tape-integrated film 1 for semiconductor back surface shown in FIG. 1 as an example. First, the base material 31 can be formed by a conventionally known film-forming method. Examples of the film-forming method include a calendar film-forming method, a casting method in an organic solvent, an inflation extrusion method in a closely sealed system, a T-die extrusion method, a co-extrusion method, and a dry laminating method.

Next, the pressure-sensitive adhesive composition is applied to the base material 31 and dried thereon (and optionally crosslinked under heat) to form the pressure-sensitive adhesive layer 32. The coating system includes roll coating, screen coating, gravure coating, etc. The pressure-sensitive adhesive composition may be directly applied to the base material 31 to form the pressure-sensitive adhesive layer 32 on the base material 31; or the pressure-sensitive adhesive composition may be applied to a release sheet or the like of which the surface has been processed for lubrication, to form the pressure-sensitive adhesive layer 32 thereon, and the pressure-sensitive adhesive layer 32 may be transferred onto the base material 31. With that, the dicing tape 3 is formed having the pressure-sensitive adhesive layer 32 formed on the base material 31.

On the other hand, a coated layer is formed by applying a forming material for forming the film 2 for semiconductor back surface onto a release paper so as to have a prescribed thickness after drying and further drying under prescribed conditions (in the case that thermal curing is necessary, performing a heating treatment and drying according to needs). The film 2 for semiconductor back surface is formed on the pressure-sensitive adhesive layer 32 by transferring the coated layer onto the pressure-sensitive adhesive layer 32. In this regard, the film 2 for semiconductor back surface can be also formed on the pressure-sensitive adhesive layer 32 by directly applying the forming material for forming the film 2 for semiconductor back surface onto the pressure-sensitive adhesive layer 32, followed by drying under prescribed conditions (in the case that thermal curing is necessary, performing a heating treatment and drying according to needs). Consequently, the dicing tape-integrated film 1 for semiconductor back surface according to the invention can be obtained. Incidentally, in the case that thermal curing is performed at the formation of the film 2 for semiconductor back surface, it is important to perform the thermal curing to such a degree that a partial curing is achieved but preferably, the thermal curing is not performed.

The dicing tape-integrated film 1 for semiconductor back surface of the invention can be suitably used at the production of a semiconductor device including the flip chip connection step. Namely, the dicing tape-integrated film 1 for semiconductor back surface of the invention is used at the production of a flip chip-mounted semiconductor device and thus the flip chip-mounted semiconductor device is produced in a condition or form where the film 2 for semiconductor back surface of the dicing tape-integrated film 1 for semiconductor back surface is attached to the back surface of the semiconductor chip. Therefore, the dicing tape-integrated film 1 for semiconductor back surface of the invention can be used for a flip chip-mounted semiconductor device (a semiconductor device in a state or form where the semiconductor chip is fixed to an adherend such as a substrate by a flip chip bonding method).

The film 2 for semiconductor back surface is usable also for flip chip-mounted semiconductor devices (semiconductor devices in a state or form where a semiconductor chip is fixed to the adherend such as a substrate or the like in a flip chip bonding method), like in the dicing tape-integrated film 1 for semiconductor back surface.

(Semiconductor Wafer)

The semiconductor wafer is not particularly restricted as long as it is a known or commonly used semiconductor wafer and can be appropriately selected and used among semiconductor wafers made of various materials. In the invention, as the semiconductor wafer, a silicon wafer can be suitable used.

(Production Process of Semiconductor Device)

The process for producing a semiconductor device according to the invention will be described referring to FIGS. 2A to 2D. FIGS. 2A to 2D are cross-sectional schematic views showing a process for producing a semiconductor device in the case where a dicing tape-integrated film 1 for semiconductor back surface is used.

According to the semiconductor device production method, a semiconductor device can be produced using the dicing tape-integrated film 1 for semiconductor back surface. Concretely, the method comprises a step of attaching a semiconductor wafer onto the dicing tape-integrated film for semiconductor back surface, a step of dicing the semiconductor wafer, a step of picking up the semiconductor element obtained by dicing, and a step of flip chip-connecting the semiconductor element onto an adherend.

Incidentally, when using the film 2 for semiconductor back surface, a semiconductor device can also be produced according to the semiconductor device production method of using the dicing tape-integrated film 1 for semiconductor back surface. For example, the film 2 for semiconductor back surface is attached to and integrated with a dicing tape to prepare a dicing tape-integrated film for semiconductor back surface, and a semiconductor device can be produced using the dicing tape-integrated film. In this case, the semiconductor device production method of using the film 2 for semiconductor back surface comprises the steps constituting the semiconductor device production method of using a dicing tape-integrated film for semiconductor back surface mentioned above, and, as combined therewith, an additional step of attaching a film for semiconductor back surface and a dicing tape in such a manner that the film for semiconductor back surface could be in contact with the pressure-sensitive adhesive layer of the dicing tape.

Alternatively, the film 2 for semiconductor back surface may be used by being directly attached to a semiconductor wafer without integrated with a dicing tape. In this case, the semiconductor device production method of using the film 2 for semiconductor back surface comprises a step of attaching a film for semiconductor back surface to a semiconductor wafer followed by a step of attaching a dicing tape to the film for semiconductor back surface with the semiconductor wafer attached thereto, in such a manner that the film for semiconductor back surface could be in contact with the pressure-sensitive adhesive layer of the dicing tape, in place of the step of attaching a semiconductor wafer onto a dicing tape-integrated film for semiconductor back surface in the semiconductor device production method of using a dicing tape-integrated film for semiconductor back surface mentioned above.

In another application embodiment thereof, the film 2 for semiconductor back surface may be directly attached to the semiconductor chip prepared by dicing a semiconductor wafer into individual semiconductor chips. In this case, the semiconductor device production method of using the film 2 for semiconductor back surface comprises, for example, at least a step of attaching a dicing tape to a semiconductor wafer, a step of dicing the semiconductor wafer, a step of picking up the semiconductor element obtained by the dicing, a step of flip chip-connecting the semiconductor element onto an adherend, and a step of attaching a film for semiconductor back surface to the semiconductor element.

(Mounting Step)

Figure 2A:
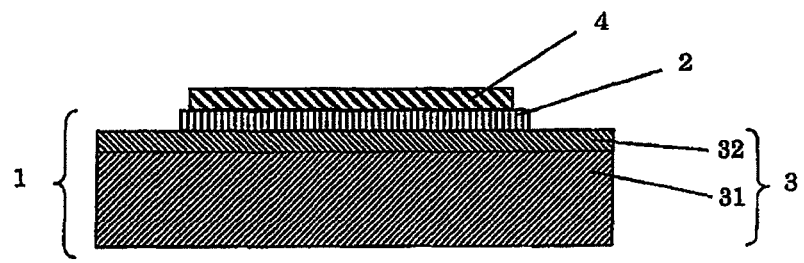
FIGS. 2A to 2D are cross-sectional schematic views showing one embodiment of a process for producing a semiconductor device using a dicing tape-integrated film for semiconductor back surface of the invention.

First, as shown in FIG. 2A, a separator optionally provided on the film 2 for semiconductor back surface of the dicing tape-integrated film 1 for semiconductor back surface is suitably peeled off and the semiconductor wafer 4 is attached onto the film 2 for semiconductor back surface to be fixed by adhesion and holding (mounting step). On this occasion, the film 2 for semiconductor back surface is in an uncured state (including a semi-cured state). Moreover, the dicing tape-integrated film 1 for semiconductor back surface is attached to the back surface of the semiconductor wafer 4. The back surface of the semiconductor wafer 4 means a face opposite to the circuit face (also referred to as non-circuit face, non-electrode-formed face, etc.). The attaching method is not particularly restricted but a method by press bonding is preferred. The press bonding is usually performed while pressing with a pressing means such as a pressing roll.

(Dicing Step)

Figure 2B:
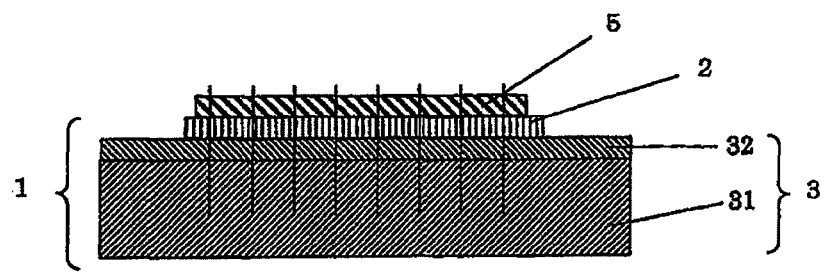

Next, as shown in FIG. 2B, the semiconductor wafer 4 is diced. Thereby, the semiconductor wafer 4 is cut into a prescribed size and individualized (is formed into small pieces) to produce semiconductor chips 5. The dicing is performed according to a normal method from the circuit face side of the semiconductor wafer 4, for example. Moreover, the present step can adopt, for example, a cutting method called full-cut that forms a slit reaching the dicing tape-integrated film 1 for semiconductor back surface. The dicing apparatus used in the present step is not particularly restricted, and a conventionally known apparatus can be used. Further, since the semiconductor wafer 4 is adhered and fixed by the dicing tape-integrated film 1 for semiconductor back surface having the film for semiconductor back surface, chip crack and chip fly can be suppressed, as well as the damage of the semiconductor wafer 4 can also be suppressed. In this regard, when the film 2 for semiconductor back surface is formed of a resin composition containing an epoxy resin, generation of adhesive extrusion from the adhesive layer of the film for semiconductor back surface can be suppressed or prevented at the cut surface even when it is cut by dicing. As a result, re-attachment (blocking) of the cut surfaces themselves can be suppressed or prevented and thus the picking-up to be mentioned below can be further conveniently performed.

In the case where the dicing tape-integrated film 1 for semiconductor back surface is expanded, the expansion can be performed using a conventionally known expanding apparatus. The expanding apparatus has a doughnut-shaped outer ring capable of pushing the dicing tape-integrated film 1 for semiconductor back surface downward through a dicing ring and an inner ring which has a diameter smaller than the outer ring and supports the dicing tape-integrated film for semiconductor back surface. Owing to the expanding step, it is possible to prevent the damage of adjacent semiconductor chips through contact with each other in the picking-up step to be mentioned below.

(Picking-Up Step)

Figure 2C:
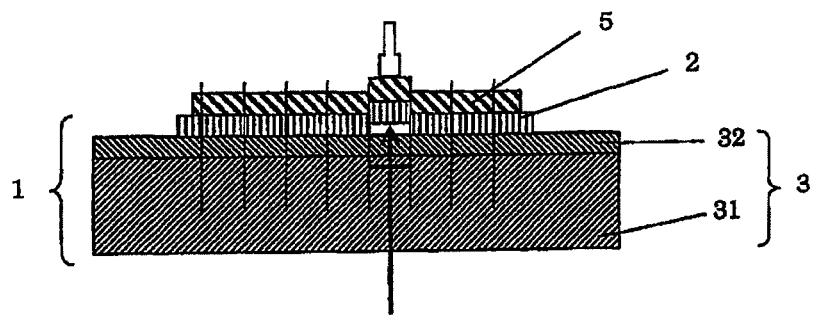

In order to collect the semiconductor chip 5 that is adhered and fixed to the dicing tape-integrated film 1 for semiconductor back surface, picking-up of the semiconductor chip 5 is performed as shown in FIG. 2C to peel the semiconductor chip 5 together with the film 2 for semiconductor back surface from the dicing tape 3. The method of picking-up is not particularly restricted, and conventionally known various methods can be adopted. For example, there may be mentioned a method including pushing up each semiconductor chip 5 from the base material 31 side of the dicing tape-integrated film 1 for semiconductor back surface with a needle and picking-up the pushed semiconductor chip 5 with a picking-up apparatus. In this regard, the back surface of the picked-up semiconductor chip 5 is protected with the film 2 for semiconductor back surface.

(Flip Chip Connecting Step)

Figure 2D:
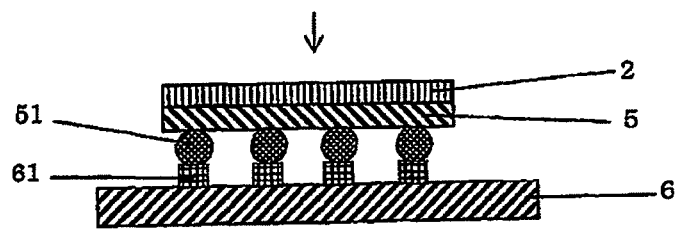

The picked-up semiconductor chip 5 is fixed on an adherend such as a substrate according to a flip chip bonding method (flip chip mounting method), as shown in FIG. 2D. Concretely, the semiconductor chip 5 is fixed on the adherend 6 according to an ordinary method in such a manner that the circuit face of the semiconductor chip 5 (this may be referred to as a front surface, a circuit pattern formed surface or an electrode formed surface) could face the adherend 6. For example, while the bump 51 formed on the circuit surface side of the semiconductor chip 5 is pressed against the bonding conductive material (e.g., solder) 61 attached to the connecting pad of the adherend 6, the conductive material is melted to secure the electric connection between the semiconductor chip 5 and the adherend 6 and the semiconductor chip 5 is thereby fixed to the adherend 6 (flip chip-bonding step). In this case, gaps are formed between the semiconductor chip 5 and the adherend 6, and the gap distance may be generally from 30 μm to 300 μm or so. After the semiconductor chip 5 has been flip chip-bonded (flip chip-connected) onto the adherend 6, it is important that the interface and the gaps between the semiconductor chip 5 and the adherend 6 are cleaned up and the two are sealed up by filling the gaps with an encapsulating material (e.g., encapsulating resin).

As the adherend 6, various substrates such as lead frames and circuit boards (such as wiring circuit boards) can be used. The material of the substrates is not particularly restricted and there may be mentioned ceramic substrates and plastic substrates. Examples of the plastic substrates include epoxy substrates, bismaleimide triazine substrates, and polyimide substrates.

In the flip chip bonding step, the material of the bump and the conductive material is not particularly restricted and examples thereof include solders (alloys) such as tin-lead-based metal materials, tin-silver-based metal materials, tin-silver-copper-based metal materials, tin-zinc-based metal materials, and tin-zinc-bismuth-based metal materials, and gold-based metal materials and copper-based metal materials.

Incidentally, in the flip chip bonding step, the conductive material is melted to connect the bump at the circuit face side of the semiconductor chip 5 and the conductive material on the surface of the adherend 6. The temperature at the melting of the conductive material is usually about 260° C. (e.g., 250° C. to 300° C.). The dicing tape-integrated film for semiconductor back surface of the invention can be made to have thermal resistance capable of enduring the high temperature in the flip chip bonding step by forming the film for semiconductor back surface with an epoxy resin or the like.

In the present step, it is preferred to wash the opposing face (electrode-formed face) between the semiconductor chip 5 and the adherend 6 and the gaps. The washing liquid to be used at the washing is not particularly restricted and examples thereof include organic washing liquids and aqueous washing liquids. The film for semiconductor back surface in the dicing tape-integrated film for semiconductor back surface of the invention has solvent resistance against the washing liquid and has substantially no solubility to these washing liquid. Therefore, as mentioned above, various washing liquids can be employed as the washing liquid and the washing can be achieved by any conventional method without requiring any special washing liquid.

Next, an encapsulating step for encapsulating the gap between the flip chip bonded semiconductor chip 5 and the adherend 6 is performed. The encapsulating step is performed using an encapsulating resin. The conditions for the encapsulation on this occasion is not particularly limited but usually, thermal curing (reflow) of the encapsulating resin is performed by heating at 175° C. for 60 seconds to 90 seconds. In the invention, the curing is not limited thereto and can be, for example, performed at 165° C. to 185° C. for several minutes. In the heat treatment in this step, thermal curing of not only the encapsulating resin but also the film 2 for semiconductor back surface is performed simultaneously. Thereby, both of the encapsulating resin and the film 2 for semiconductor back surface are cured and contracted with the progress of the thermal curing. As a result, the stress applied to the semiconductor chip 5 originating from the curing and contraction of the encapsulating resin can be offset or alleviated by the curing and contraction of the film 2 for semiconductor back surface. Moreover, by this step, the film 2 for semiconductor back surface can be completely or almost completely thermally cured and can be attached to the back surface of the semiconductor element with excellent adhesiveness. Furthermore, since the film 2 for semiconductor back surface according to the invention can be thermally cured together with the encapsulating material at the encapsulating step even when the film is in an uncured state, it is not necessary to add a new step for thermally curing the film 2 for semiconductor back surface.

The encapsulating resin is not particularly restricted as long as the material is a resin having an insulating property (an insulating resin) and may be suitably selected and used among known encapsulating materials such as encapsulating resins. The encapsulating resin is preferably an insulating resin having elasticity. Examples of the encapsulating resin include resin compositions containing an epoxy resin. As the epoxy resin, there may be mentioned the epoxy resins exemplified in the above. Furthermore, the encapsulating resin composed of the resin composition containing an epoxy resin may contain a thermosetting resin other than an epoxy resin (such as a phenol resin) or a thermoplastic resin in addition to the epoxy resin. Incidentally, a phenol resin can be utilized also as a curing agent for the epoxy resin and, as such a phenol resin, there may be mentioned phenol resins exemplified in the above.

According to the semiconductor device (flip chip-mounted semiconductor device) manufactured using the dicing tape-integrated film 1 for semiconductor back surface or the film 2 for semiconductor back surface, the film for semiconductor back surface is attached to the back surface of the semiconductor chip, and therefore, laser marking can be applied with excellent visibility. In particular, even when the marking method is a laser marking method, laser marking can be applied with an excellent contrast ratio, and it is possible to observe various kinds of information (for example, literal information and graphical information) applied by laser marking with good visibility. At the laser marking, a known laser marking apparatus can be utilized. Moreover, as the laser, it is possible to utilize various lasers such as a gas laser, a solid-state laser, and a liquid laser. Specifically, as the gas laser, any known gas lasers can be utilized without particular limitation but a carbon dioxide laser ($CO_2$ laser) and an excimer laser (ArF laser, KrF laser, XeCl laser, XeF laser, etc.) are suitable. As the solid-state laser, any known solid-state lasers can be utilized without particular limitation but a YAG laser (such as Nd:YAG laser) and a $YVO_4$ laser are suitable.

After the laser marking of the film 2 for semiconductor back surface, a heat treatment (reflow step to be performed after the laser marking) may be performed according to need. Conditions for the heat treatment are not particularly limited, but it can be performed in accordance with the standard of JEDEC Solid State Technology Association (JEDEC). For example, it can be performed at a temperature (upper limit) within a range of 210 to 270° C. for a time within a range of 5 to 50 seconds. By this step, the semiconductor package can be mounted on a substrate (such as a mother board).

Since the semiconductor device produced using the dicing tape-integrated film for semiconductor back surface 1 or the film for semiconductor back surface 2 of the invention is a semiconductor device mounted by the flip chip mounting method, the device has a thinned and miniaturized shape as compared with a semiconductor device mounted by a die-bonding mounting method. Thus, the semiconductor devices can be suitably employed as various electronic devices and electronic parts or materials and members thereof. Specifically, as the electronic devices in which the flip chip-mounted semiconductor devices of the invention are utilized, there may be mentioned so-called "mobile phones" and "PHS", small-sized computers [e.g., so-called "PDA" (handheld terminals), so-called "notebook-sized personal computer", so-called "Net Book (trademark)", and so-called "wearable computers", etc.], small-sized electronic devices having a form where a "mobile phone" and a computer are integrated, so-called "Digital Camera (trademark)", so-called "digital video cameras", small-sized television sets, small-sized game machines, small-sized digital audio players, so-called "electronic notepads", so-called "electronic dictionary", electronic device terminals for so-called "electronic books", mobile electronic devices (portable electronic devices) such as small-sized digital type watches, and the like. Needless to say, electronic devices (stationary type ones, etc.) other than mobile ones, e.g., so-called "desktop personal computers", thin type television sets, electronic devices for recording and reproduction (hard disk recorders, DVD players, etc.), projectors, micromachines, and the like may be also mentioned. In addition, electronic parts or materials and members for electronic devices and electronic parts are not particularly restricted and examples thereof include parts for so-called "CPU" and members for various memory devices (so-called "memories", hard disks, etc.).

EXAMPLES

The following will illustratively describe preferred Examples of the invention in detail. However, the invention is not limited to the following Examples unless it exceeds the gist thereof. Moreover, part in each example is a weight standard unless otherwise stated.

Example 1

<Preparation of Film for Flip Chip Type Semiconductor Back Surface>

117 parts of an epoxy resin (trade name "EPIKOTE 1004" manufactured by JER Co., Ltd.), 117 parts of a phenol resin (trade name "MIREX XLC-4L" manufactured by Mitsui Chemicals, Inc.), 83 parts of a spherical silica (trade name "SO-25R" manufactured by Admatechs Company Limited), 4 parts of a dye (trade name "Oil Black BS" manufactured by Orient Chemical Industries Co., Ltd.), and 1.7 parts of a thermal curing-accelerating catalyst (trade name "2PHZ-PW" manufactured by Shikoku Chemicals Corporation) based on 100 parts of an acrylic acid ester-based polymer (trade name "PARACRON W-197CM" manufactured by Negami Chemical Industrial Co., Ltd.) having ethyl acrylate and methyl methacrylate as main components were dissolved in methyl ethyl ketone to prepare a solution of an adhesive composition having a solid concentration of 23.6% by weight.

The solution of the adhesive composition was applied on a releasably treated film, as a release liner (separator), composed of a polyethylene terephthalate film having a thickness of 38 μm, which had been subjected to a silicone-releasing treatment, and then dried at 130° C. for 2 minutes to prepare a film for flip chip type semiconductor back surface having a thickness (average thickness) of 20 μm.

Examples 2 to 16 and Comparative Examples 1 and 2

In Examples 2 to 16 and Comparative Examples 1 and 2, films for flip chip type semiconductor back surface were prepared in the same manner as in Example 1 except that individual blending amounts were changed as shown in Table 1. In Table 1, blanks show 0 part by weight. The thickness of each of the obtained films for flip chip type semiconductor back surface is shown in Table 2.

TABLE 1

| | Acrylic rubber PARACRON W-197CM | Epoxy resin EPIKOTE 1004 | Phenol resin MIREX XLC-4L | Filler SO-25R | Curing catalyst 2PHZ-PW |
|---|---|---|---|---|---|
| Example 7 | 100 | 70 | 80 | 167 | |
| Examples 2 and 8 | 100 | 109 | 125 | 334 | |
| Examples 3 and 9 | 100 | 187 | 214 | 751 | |
| Examples 4 and 10 | 100 | 109 | 125 | 83 | 1 |
| Examples 5 and 11 | 100 | 187 | 214 | 334 | 2 |
| Examples 6 and 12 | 100 | 420 | 482 | 1002 | 3 |
| Example 13 | 100 | 12 | 13 | 31 | |
| Example 14 | 100 | 420 | 482 | 1503 | 3 |
| Example 15 | 100 | 12 | 13 | 125 | |
| Example 16 | 100 | 887 | 1017 | 2004 | 6 |
| Comparative Example 1 | 100 | 187 | 214 | 26 | |
| Comparative Example 2 | 100 | 887 | 1017 | 3007 | 6 |

(unit: part(s) by weight)

(Volume Contraction Ratio)

The volume contraction ratio within a range of 23° C. to 165° C. at the thermal curing of the film for flip chip type semiconductor back surface before thermal curing was determined as follows.

First, for measuring the volume contraction ratio of each of the films for flip chip type semiconductor back surface of Examples 1 to 16 and Comparative Examples 1 and 2, each of the film for flip chip type semiconductor back surface having a thickness of 60 μm was prepared. Then, a sample obtained by laminating the film for flip chip type semiconductor back surface having a thickness of 60 μm on a semiconductor chip having a size of 10 mm×10 mm and a thickness of 0.05 mm was prepared and a degree of warp "X" at the time when curing was performed under conditions of 165° C. and 2 hours was measured. The degree of warp was measured based on the method to be mentioned later. Thereafter, for the constitution where the film for flip chip type semiconductor back surface having a thickness of 60 μm was laminated on the semiconductor chip having a size of 10 mm×10 mm and a thickness of 0.05 mm, simulation was performed with changing its assumed linear expansion coefficient to determine a linear expansion coefficient at which the degree of warp was X. Then, a volume contraction ratio was obtained by tripling the linear expansion coefficient. On this occasion, temperature was changed in the range of 165° C. to 23° C. in the simulation and the linear expansion coefficient was assumed to be constant in the temperature range.

<Measurement of Tensile Storage Modulus at 23° C. after Thermal Curing>

The tensile storage modulus was obtained by preparing a thermally cured film for semiconductor back surface and measuring the modulus in a tensile mode under conditions of a sample width of 10 mm, a sample length of 22.5 mm, a sample thickness of 0.2 mm, a frequency of 1 Hz, and a temperature elevating rate of 10° C./min under a nitrogen atmosphere at a prescribed temperature (23° C.) using a dynamic viscoelasticity measuring apparatus "Solid Analyzer RS A2" manufactured by Rheometrics Co., Ltd. The results are shown in Table 2.

(Degree of Warp of Semiconductor Package)

After the separator was first peeled from the dicing tape-integrated film for semiconductor back surface, a semiconductor wafer (diameter: 8 inches, thickness: 200 μm; a silicon mirror wafer) was attached onto the film for semiconductor back surface by roller press-bonding at 70° C. Further, dicing of the semiconductor wafer was performed. The dicing was performed as full cut so as to be a chip size of 10 mm square. In this regard, attaching conditions and dicing conditions are as follows.

[Attaching Conditions]

Attaching apparatus: trade name "MA-3000III" manufactured by Nitto Seiki Co., Ltd.
Attaching speed: 10 mm/min
Attaching pressure: 0.15 MPa
Stage temperature at the time of attaching: 70° C.

[Dicing Conditions]

Dicing apparatus: trade name "DFD-6361" manufactured by DISCO Corporation
Dicing ring: "2-8-1" (manufactured by DISCO Corporation)
Dicing speed: 30 mm/sec
Dicing blade:
Z1; "203O-SE 27HCDD" manufactured by DISCO Corporation
Z2; "203O-SE 27HCBB" manufactured by DISCO Corporation
Dicing blade rotation speed:
Z1; 40,000 r/min
Z2; 45,000 r/min
Cutting method: step cutting
Wafer chip size: 10.0 mm square Next, the semiconductor chip obtained by dicing was picked up from the pressure-sensitive adhesive layer together with the film for flip chip type semiconductor back surface by pushing-up from the dicing tape side of the dicing tape-integrated film for semiconductor back surface with a needle. The picking-up conditions are as follows.

[Picking-Up Conditions]

Picking-up apparatus: trade name "SPA-300" manufactured by Shinkawa Co., Ltd.
Number of picking-up needles: 9 needles
Pushing-up speed of needle: 20 mm/s
Pushing-up distance of needle: 500 μm
Picking-up time: 1 second
Dicing tape-expanding amount: 3 mm Subsequently, the semiconductor chip was flip chip-bonded onto a BT substrate [substrate using a BT resin (bis-maleimide triazine-based resin) manufactured by Mitsubishi Gas Chemical Co., Inc.]. On this occasion, the bonding was performed as follows: the circuit surface of the semiconductor chip was faced to the BT substrate and a bump formed on the circuit surface of the semiconductor chip was brought into contact with a conducting material for bonding (solder) adhered to a connection pad of the BT substrate and temperature was elevated to 260° C. to melt the conducting material under pressing, followed by cooling to room temperature. Furthermore, an underfill material as an encapsulating resin was filled into a gap between the semiconductor chip and the BT substrate. The thickness of the underfill (encapsulating material) was 20 μm. Then, a degree of warp of the semiconductor package (degree of warp of the semiconductor package before reflow) was measured. The results are shown in Table 2.

Subsequently, the semiconductor package was heated under conditions of 260° C. and 30 minutes, and then a degree of warp of the semiconductor package (degree of warp of the semiconductor package after reflow) was measured. The results are shown in Table 2.

The measurement of the degree of warp was performed by first placing the semiconductor package on a flat plate so that the BT substrate was downside and measuring a height of the BT substrate lifted from the flat plate, i.e., a degree of warp (μm). The measurement was performed under conditions of a measuring rate of 1.5 mm/s and a load of 1 g using a contact-type surface roughness gauge (DEKTAK 8 manufactured by Veeco Instruments Inc.). As a result of the measurement, the case where the degree of warp was 100 μm or less was ranked "Very good", the case where the degree of warp was 100 μm or more to 500 μm or less was ranked "Good", the case where the degree of warp was 500 μm or more to 1,000 μm or less was ranked "Moderate", and the case where the degree is more than 1,000 μm was ranked "Bad".

TABLE 2

| | Contraction rate (ppm/° C.) (165→23° C.) | Elastic modulus (GPa) | Thickness (μm) | Before reflow Degree of warp (μm) | Evaluation | After reflow Degree of warp (μm) | Evaluation |
|---|---|---|---|---|---|---|---|
| Example 1 | 146 | 2 | 20 | −64 | Very good | −153 | Good |
| Example 2 | | 3 | | −26 | Very good | −29 | Very good |
| Example 3 | | 4 | | 14 | Very good | 112 | Good |
| Example 4 | 292 | 2 | | 16 | Very good | 104 | Good |
| Example 5 | | 3 | | 91 | Very good | 270 | Good |
| Example 6 | | 4 | | 152 | Good | 393 | Good |
| Example 7 | 146 | 2 | 30 | 52 | Very good | 15 | Very good |
| Example 8 | | 3 | | 109 | Good | 198 | Good |
| Example 9 | | 4 | | 156 | Good | 309 | Good |
| Example 10 | 292 | 2 | | 159 | Good | 300 | Good |
| Example 11 | | 3 | | 237 | Good | 528 | Moderate |
| Example 12 | | 4 | | 302 | Good | 822 | Moderate |
| Example 13 | 146 | 0.2 | 20 | −551 | Moderate | −569 | Moderate |
| Example 14 | 292 | 6 | 30 | 524 | Moderate | 938 | Moderate |
| Example 15 | 50 | 2 | 20 | −510 | Moderate | −535 | Moderate |
| Example 16 | 500 | 4 | 30 | 619 | Moderate | 953 | Moderate |
| Comparative Example 1 | 50 | 0.2 | 20 | −977 | Moderate | −1019 | Bad |
| Comparative Example 2 | 500 | 6 | 30 | 1181 | Bad | 1427 | Bad |

(Results)

As is understood from Table 2, it was confirmed that the degree of warp of a semiconductor package could be suppressed when the film for semiconductor back surface was one in which a volume contraction ratio within a range of 23° C. to 165° C. at thermal curing of the film for flip chip type semiconductor back surface before thermal curing is 100 ppm/° C. or more to 400 ppm/° C. or less, as in Examples 1 to 16.

While the present invention has been described in detail and with reference to specific embodiments thereof, it will be apparent to one skilled in the art that various changes and modifications can be made therein without departing from the scope thereof.

This application is based on Japanese patent application No. 2010-169501 filed Jul. 28, 2010, the entire contents thereof being hereby incorporated by reference.

What is claimed is:

1. A sheet for flip chip type semiconductor back surface to be formed on a back surface of a semiconductor element flip chip-connected onto an adherend,
wherein the sheet for flip chip type semiconductor back surface is a sheet before thermal curing and has, at the thermal curing thereof, a volume contraction ratio within a range of 23° C. to 165° C. of 100 ppm/° C. to 400 ppm/° C.,
wherein a tensile storage elastic modulus of the sheet in an uncured state at 23° C. is 1 GPa or more, and
wherein the sheet after the thermal curing has a tensile storage elastic modulus at 23° C. within a range of 1 GPa to 5 GPa.

2. The sheet for flip chip type semiconductor back surface according to claim 1, wherein the sheet for flip chip type semiconductor back surface has a thickness within a range of 10 μm to 40 μm.

3. A dicing tape-integrated sheet for semiconductor back surface, comprising a dicing tape and the sheet for flip chip type semiconductor back surface according to claim 1 laminated on the dicing tape,
wherein the dicing tape comprises a base material and a pressure-sensitive adhesive layer laminated on the base material, and the sheet for flip chip type semiconductor back surface is laminated on the pressure-sensitive adhesive layer of the dicing tape.

4. A process for producing a semiconductor device using the dicing tape-integrated sheet for semiconductor back surface according to claim 3, the process comprising:
attaching a semiconductor wafer onto the sheet for flip chip type semiconductor back surface of the dicing tape-integrated sheet for semiconductor back surface,
dicing the semiconductor wafer to form a semiconductor element,
peeling the semiconductor element from the pressure-sensitive adhesive layer of the dicing tape together with the sheet for flip chip type semiconductor back surface, and
connecting the semiconductor element onto an adherend.

5. The process for producing a semiconductor device according to claim 4, wherein said flip chip connecting comprises filling an encapsulating resin into a gap between the adherend and the semiconductor element flip chip-bonded on the adherend, followed by thermally curing the encapsulating resin.

6. A flip chip type semiconductor device comprising an adherend, a semiconductor element mounted on the adherend, and a sheet for flip chip type semiconductor back surface,
wherein the sheet for flip chip type semiconductor back surface is a sheet before thermal curing and has, at the thermal curing thereof, a volume contraction ratio within a range of 23° C. to 165° C. of 100 ppm/° C. to 400 ppm/° C.,
wherein a tensile storage elastic modulus of the sheet in an uncured state at 23° C. is 1 GPa or more, and
wherein the sheet after the thermal curing has a tensile storage elastic modulus at 23° C. within a range of 1 GPa to 5 GPa.

* * * * *